(12) United States Patent
Shin

(10) Patent No.: US 7,663,580 B2
(45) Date of Patent: Feb. 16, 2010

(54) LIGHT EMITTING DISPLAY AND DRIVING DEVICE AND METHOD THEREOF

(75) Inventor: Dong-Yong Shin, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 694 days.

(21) Appl. No.: 11/137,450

(22) Filed: May 26, 2005

(65) Prior Publication Data

US 2005/0285824 A1    Dec. 29, 2005

(30) Foreign Application Priority Data

| Jun. 25, 2004 | (KR) | ................. 10-2004-0048152 |
| Jun. 25, 2004 | (KR) | ................. 10-2004-0048153 |
| Jun. 25, 2004 | (KR) | ................. 10-2004-0048154 |

(51) Int. Cl.
*G09G 3/32*    (2006.01)

(52) U.S. Cl. ........................... 345/82; 345/100

(58) Field of Classification Search ............ 345/82, 345/98, 99, 100; 315/169.1, 169.2, 169.3
See application file for complete search history.

(56) References Cited

U.S. PATENT DOCUMENTS

| 5,883,609 | A * | 3/1999 | Asada et al. ................ 345/100 |
| 6,417,830 | B1 | 7/2002 | Byeon, II |
| 7,030,851 | B2 * | 4/2006 | Yamazaki ................... 345/100 |
| 7,324,101 | B2 * | 1/2008 | Miyazawa ................... 345/211 |

| 2002/0163493 | A1 * | 11/2002 | Matsushima et al. ......... 345/98 |

FOREIGN PATENT DOCUMENTS

| CN | 1278635 | 1/2001 |
| EP | 1 061 497 | 12/2000 |
| EP | 1 424 674 | 6/2004 |
| JP | 2001-060076 | 3/2001 |
| JP | 2004-361935 | 12/2004 |
| JP | 2005-164823 | 6/2005 |
| WO | WO 03/023750 A1 | 3/2003 |
| WO | WO 03/023752 A1 | 3/2003 |
| WO | WO 03/027998 A1 | 4/2003 |

OTHER PUBLICATIONS

European Office Action of the European Patent Application No. 05 10 5436, issued on Jan. 17, 2006.

* cited by examiner

*Primary Examiner*—Chanh Nguyen
*Assistant Examiner*—Pegeman Karimi
(74) *Attorney, Agent, or Firm*—Robert E. Bushnell, Esq.

(57) ABSTRACT

A driving device for a light emitting display, which includes a plurality of scan lines for transferring a selection signal, comprises: a first driver for shifting a first signal having a first integer multiple of first pulses by a first period, and sequentially outputting the first signal; a second driver for shifting a second signal having a second pulse by a second period, and sequentially outputting the second signal; and a third driver for sequentially outputting the selection signal having a second integer multiple of third pulses corresponding to at least one of the first integer multiple of first pulses, and a fourth pulse corresponding to the second pulse, in response to the first signal and the second signal.

39 Claims, 25 Drawing Sheets

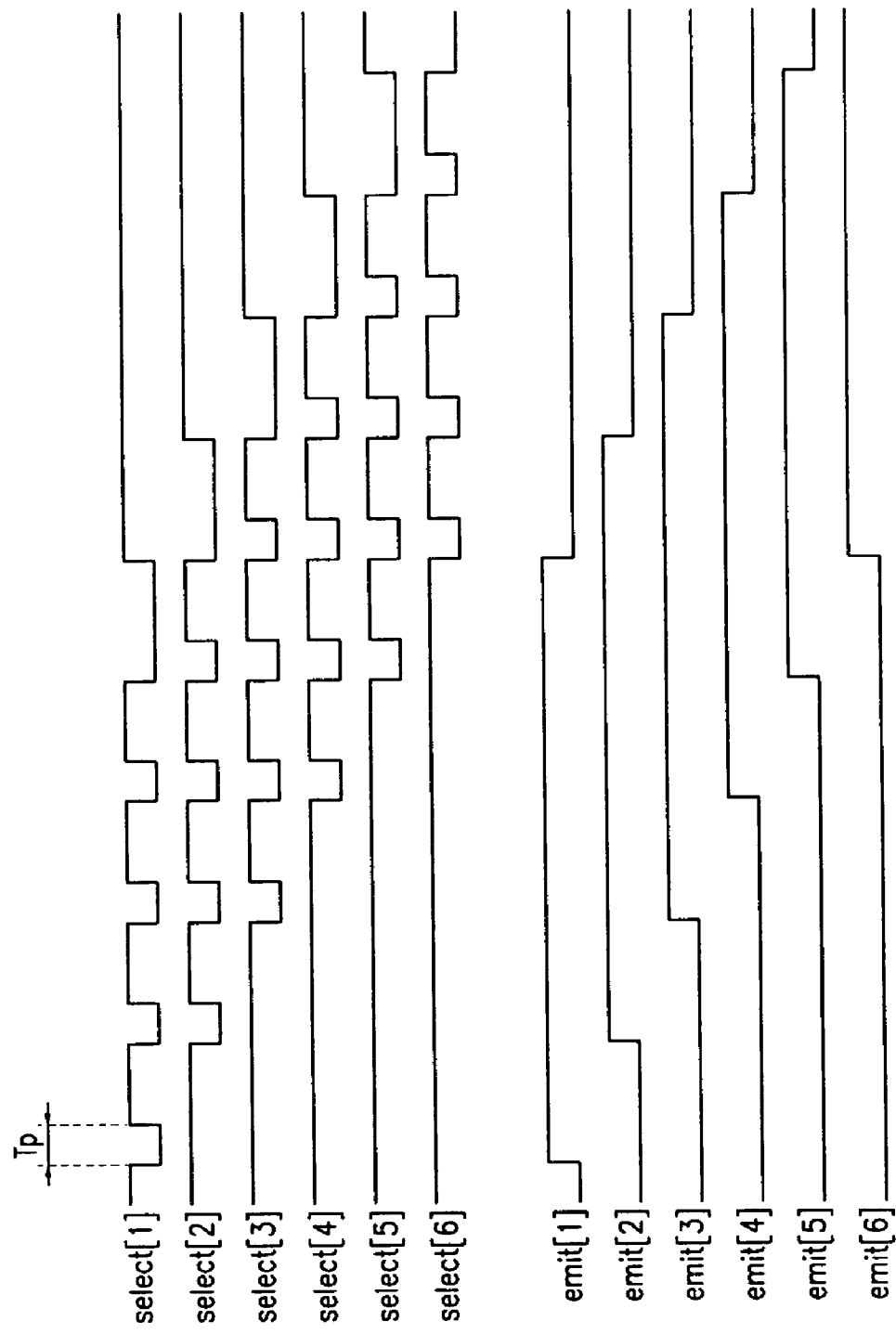

LIGHT EMITTING DISPLAY AND DRIVING DEVICE AND METHOD THEREOF

CLAIM OF PRIORITY

This application makes reference to, incorporates the same herein, and claims all benefits accruing under 35 U.S.C. § 119 from three applications for LIGHT EMITTING DISPLAY AND DRIVING DEVICE AND METHOD THEREOF all of which were earlier filed in the Korean Intellectual Property Office on 25 Jun. 2005, and there duly assigned Serial Nos. 10-2004-0048152, 10-2004-0048153 and 10-2004-0048154.

BACKGROUND OF THE INVENTION

1. Technical Field

The present invention relates to a light emitting display, a driving device thereof, and a driving method thereof. More specifically, the present invention relates to a light emitting display using an organic light emitting diode (OLED), and a driving method thereof.

2. Related Art

In general, an OLED display electrically excites a phosphorous organic compound to emit light, and it voltage-drives or current-drives a plurality of organic emitting cells to display images. The organic emitting cell includes an anode, an organic thin film, and a cathode layer.

A method for driving the organic emission cells can be classified as a passive matrix method or as an active matrix method using thin film transistors (TFTs). The passive matrix method provides anodes and cathodes that cross (or cross over) each other, in which method a line to drive the organic emission cells is selected. The active matrix method provides TFTs that access respective pixel electrodes, and a pixel is driven according to a voltage maintained by a capacitance of a capacitor accessed by a gate of a TFT. Depending on the formats of the signals applied to capacitors for establishing the voltage, the active matrix method can be categorized as a voltage programming method or a current programming method.

The pixel circuit of the voltage programming method has a difficulty in obtaining high gray scales because of deviations of the threshold voltage $V^{TH}$ and carrier mobility, the deviations being caused by non-uniformity in the manufacturing process. For example, in order to represent 8-bit (i.e., 256) gray scales in the case of driving thin film transistors by a voltage of 3V (volts), it is required to apply the voltage to the gate of the thin film transistor with an interval less than a voltage of 12 mV (=3V/256). If the deviation of the threshold voltage of the thin film transistor caused by the non-uniformity in the manufacturing process is 100 mV, it is difficult to represent high gray scales.

However, the pixel circuit of the current programming method achieves uniform display characteristics when the driving transistor in each pixel has non-uniform voltage-current characteristics, provided that a current source for supplying the current to the pixel circuit is uniform throughout the whole panel.

However, the pixel circuit of the current programming method involves a long data programming time because of a parasitic capacitance component provided on the data line. In particular, the time for programming the data on the current pixel line is influenced by the voltage state of the data line according to the data of a previous pixel line, and in particular, the data programming time is further lengthened when the data line is charged with a voltage which is very different from the target voltage (the voltage corresponding to the current data). This phenomenon becomes an even greater factor as the gray level becomes lower (near black).

SUMMARY OF THE INVENTION

It is an aspect of the present invention to reduce the data programming time in a light emitting display based on the current driving method.

In an exemplary embodiment of the present invention, a driving device for a light emitting display which includes a plurality of scan lines for transferring a selection signal is provided. The driving device of a light emitting display includes: a first driver for shifting a first signal having a first integer multiple of first pulses by a first period, and sequentially outputting the first signal; a second driver for shifting a second signal having a second pulse by a second period, and sequentially outputting the second signal; and a third driver for sequentially outputting a selection signal having a second integer multiple of third pulses corresponding to at least one of the first integer multiple of first pulses, and for outputting a fourth pulse corresponding to the second pulse in response to the first signal and the second signal.

The first driver may include: a fourth driver for shifting a third signal having a first integer multiple of first pulses by a third period, and sequentially outputting the third signal; and a fifth driver for selecting a third signal which is sequentially shifted by the first period in response to one of the third signals sequentially outputted from the fourth driver, the first period being a third integer multiple of the third period.

The first driver may include: a fourth driver for shifting by the first period a third signal having a third integer multiple of fifth pulses, and sequentially outputting the third signal; a fifth driver for shifting by the first period a fourth signal having a sixth pulse, which is a fifth pulse shifted by the third period, and sequentially outputting the fourth signal; and a sixth driver for outputting a first signal having the first pulse in a period in which levels of the first signal and the second signal are different.

The first driver may include: a fourth driver for shifting a third signal having a fifth pulse by the first period, and sequentially outputting the fifth signal; and a fifth driver for receiving the third signal and a fourth signal having a sixth pulse repeated in a predetermined cycle, and outputting the first signal having the first pulse in a period in which the fifth pulse and the sixth pulse overlap each other.

In another exemplary embodiment of the present invention, a light emitting display includes a display area and a scan driver. The display area includes a plurality of data lines for transferring a data signal, a plurality of scan lines arranged in a direction crossing the data line, and a plurality of pixels coupled to the data lines and the scan lines, respectively. The scan driver sequentially applies a selection signal having at least one of a first level of a first pulse and the first level of a second pulse to the plurality of scan lines, the second pulse having a narrower width than the first pulse.

In another exemplary embodiment of the present invention, a driving method of a light emitting display having a plurality of scan lines for transferring a selection signal is provided. The driving method of the light emitting display includes the steps of: sequentially outputting a first signal having at least one first level of a first pulse while shifting the first signal by a first interval; selecting the first signal shifted by a second interval of the first signals sequentially outputted as a second signal, the second interval being an integer multiple of the first interval; outputting a third signal having a third pulse corresponding to the first pulse in the second signal; and generating at least one fourth pulse in response to at least one third pulse in the third signal, and outputting the selection signal having at least one fourth pulse.

In another exemplary embodiment of the present invention, a driving method of a light emitting display having a plurality of scan lines for transferring a selection signal is provided. The driving method of the light emitting display includes the steps of: outputting a first signal having at least one first level of a first pulse; outputting a second signal having at least one first level of a second pulse, wherein a start time point is shifted by a predetermined period from a start time point of the first pulse; outputting a third signal having a third level of a third pulse in at least one period in which levels of the first signal and the second signal are different; and generating at least one fourth pulse in response to each of at least one third pulse in the third signal, and outputting the selection signal having the at least one fourth pulse.

In another exemplary embodiment of the present invention, a driving method of a light emitting display having a plurality of scan lines for transferring a selection signal is provided. The driving method of the light emitting display includes the steps of: outputting a first signal having a first level of a first pulse repeated in a predetermined cycle; outputting a second signal having a second level of a second pulse, wherein a width includes at least one first pulse; selecting at least one first pulse with the second pulse of the second signal; and outputting a third signal having a third pulse corresponding to the selected first pulse, generating at least one fourth pulse in response to at least one third pulse in the third signal, and outputting the selection signal having at least one fourth pulse.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 4 is a driving timing diagram of a light emitting display according to the first exemplary embodiment of the present invention;

DETAILED DESCRIPTION OF THE INVENTION

Figure 1:
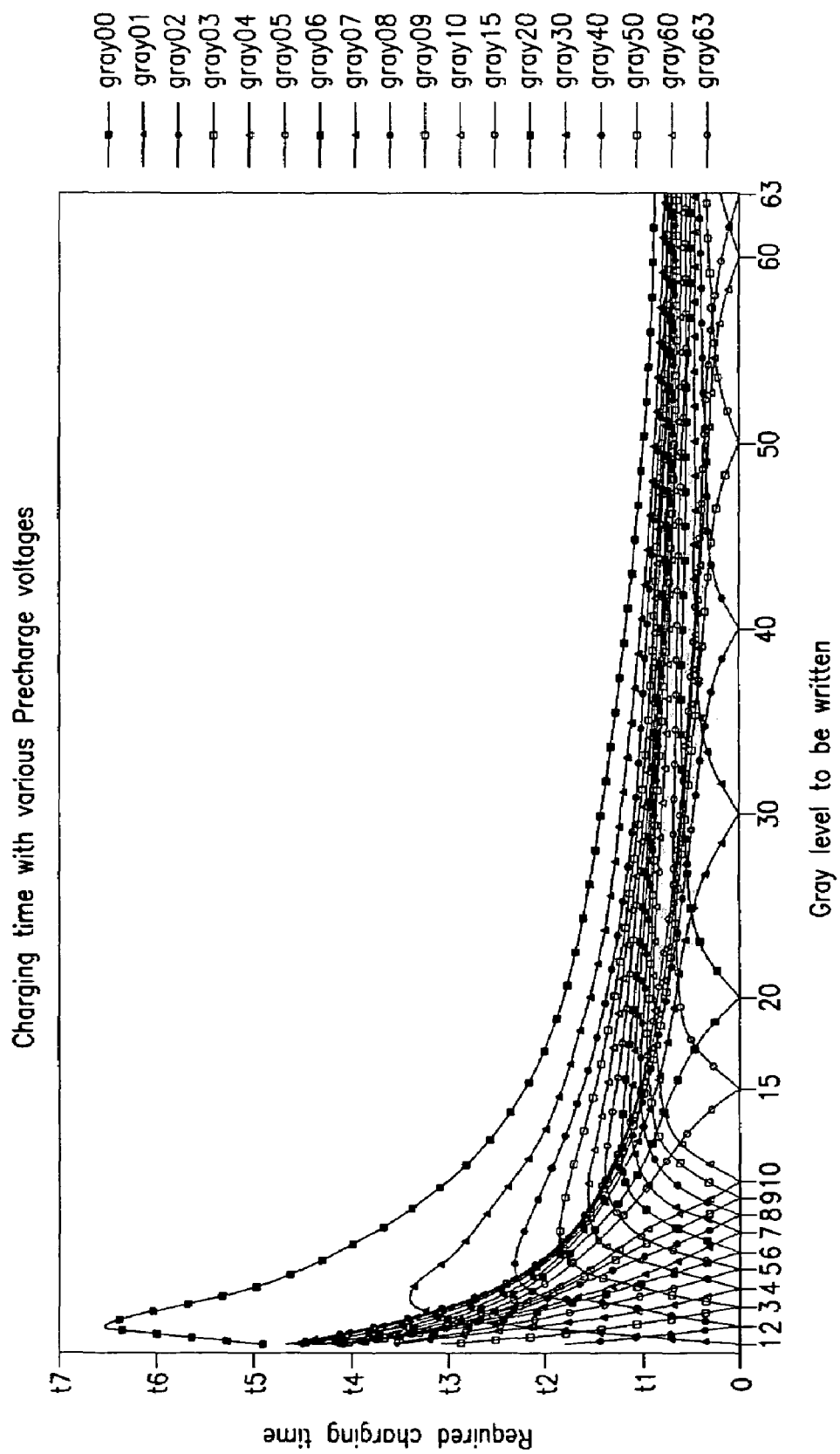
FIG. 1 is a graph illustrating variations of data programming times versus gray levels to be written in a light emitting display device.

FIG. 1 is a graph illustrating variations of data programming times versus gray levels to be written in a light emitting display device.

The time t1 to t7 in FIG. 1 represents the data programming times, and the gray lines (e.g., gray 00 through gray 63) on the right of the graph indicate gray levels of the data programmed to the pixel circuit coupled to the previous pixel line.

For example, when the gray level of the data programmed to the pixel circuit coupled to the previous pixel line is "8" and the gray level of the data to be programmed to the pixel circuit coupled to the current pixel line is 8 (i.e., a point where a curve meets the horizontal axis), the time needed for data programming is almost "0" since there is no difference between the voltage state of the data line and the target voltage.

By contrast, the time needed for data programming increases as the difference between the voltage state of the data line and the target voltage increases because the gray level of the data to be currently programmed becomes further away from the gray level of 8.

Also, the time needed for data programming is inversely proportional to the magnitude of the data current for driving the data line. As such, when the gray level is to be lowered, the data current for driving the data line is reduced, and hence, the data programming time is increased. That is, as can be derived from FIG. 1, when the gray level is lowered (e.g., to near the black level), the data voltage is changed so that is has a large voltage range with a low driving current, and the data programming time is increased.

In the following detailed description, only certain exemplary embodiments of the present invention are shown and described, simply by way of illustration. As those skilled in the art will realize, the described embodiments may be modified in various different ways, all without departing from the spirit or scope of the present invention. Accordingly, the drawings and description are to be regarded as illustrative in nature, and not restrictive.

In the context of the present application, to couple one thing to another refers to directly couple a first thing to a second thing, or to couple a first thing to a second thing with a third thing provided therebetween. In addition, to clarify the present invention as shown in the drawings, certain components which are not described in the specification may be omitted, and like reference numerals indicate like components.

Hereinafter, a light emitting display and a driving method thereof according to exemplary embodiments of the present invention will be described in detail with reference to drawings. In exemplary embodiments of the present invention, the light emitting display is described as an organic light emitting diode (OLED). However, the present invention should not be limited to the OLED display.

First, a light emitting display according to a first exemplary embodiment of the present invention is described in detail with reference to FIG. 2, which is a simplified plan view of a light emitting display according to a first exemplary embodiment of the present invention.

Figure 2:
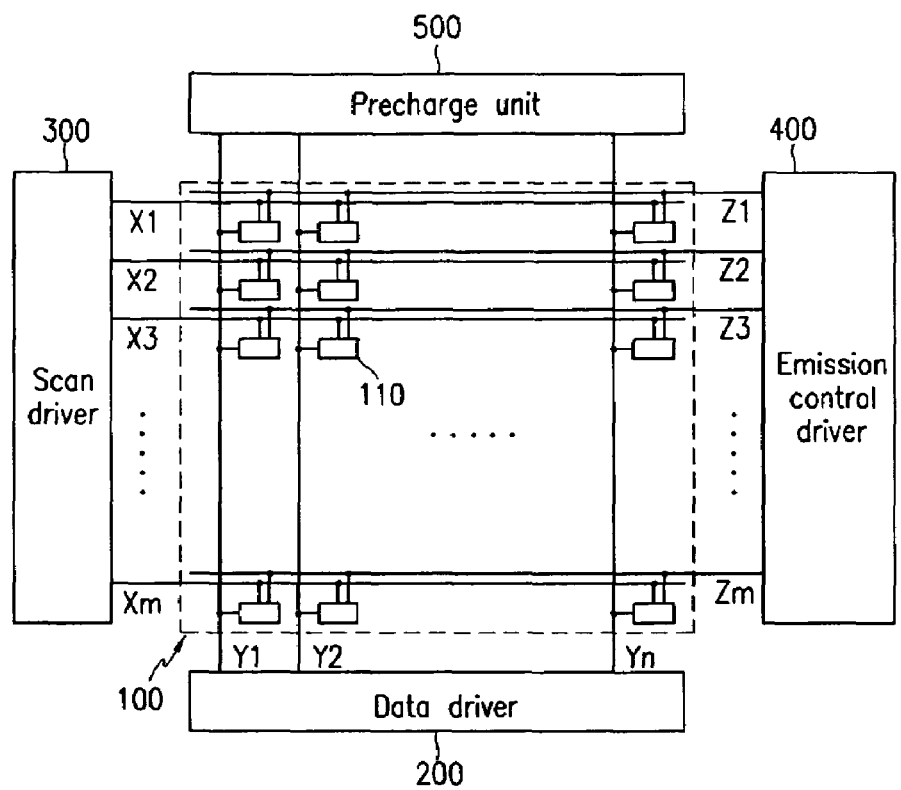
FIG. 2 is a simplified plan view of a light emitting display according to a first exemplary embodiment of the present invention.

As shown in FIG. 2, the light emitting display according to the first exemplary embodiment includes display panel 100, data driver 200, scan driver 300, emission control driver 400, and precharge unit 500.

Display panel 100 includes a plurality of data lines $Y_1$ to $Y_n$ arranged in a column direction, a plurality of selection scan lines $X_1$ to $X_m$ and a plurality of emitting scan lines $Z_1$ to $Z_m$ arranged in a row direction, and a plurality of pixel circuits 110. The selection scan lines $X_1$ to $X_m$ transmit selection signals for selecting pixels, and the emitting scan lines $Z_1$ to $Z_m$ transmit emit signals for controlling an emit period of an organic light emitting element (or OLED). Pixel circuits 110 are formed at pixel areas defined by data lines $Y_1$ to $Y_n$ and selection scan lines $X_1$ to $X_m$.

Data driver 200 applies a data current $I_{data}$ to the data lines $Y_1$ to $Y_n$. Furthermore, data driver 200 applies a precharge current $NI_{data}$ to the data lines $Y_1$ to $Y_n$, the precharge current $NI_{data}$ being N times the data current $I_{data}$. Thus, data driver 200 includes a first current source for generating the data current $I_{data}$ and a second current source for generating the precharge current $NI_{data}$. The precharge current $NI_{data}$ can be generated from the data current $I_{data}$ by a current mirror circuit or the like. The methods for generating the precharge current are well known to a person of ordinary skill in the art, and thus a detailed description of the method for generating the precharge current is not given. However, data driver 200 can alternatively supply the precharge current $NI_{data}$ and the data current $I_{data}$ to the data lines according to a control signal applied from an external controller (not shown).

Scan driver 300 sequentially applies the selection signals to the selection scan lines $X_1$ to $X_m$ so as to select pixel circuits 110. Emit control driver 400 sequentially applies the emit signals to the emitting scan lines $Z_1$ to $Z_m$ so as to control light emission of the pixel circuits 110.

Scan driver 300, emit control driver 400 and/or data driver 200 can be electronically coupled to the display panel 100, or can be installed as a chip by means of a tape carrier package (TCP) attached and electronically coupled to display panel 100. They can also be installed as a chip on a flexible printed circuit (FPC) or as a film attached and electronically coupled to display panel 100. In addition, they can be directly installed on a glass substrate of the display panel, or they can also be replaced by a driving circuit on the same layer as that of signal lines, data lines, and thin film transistors (TFTs).

In the first exemplary embodiment of the present invention, the precharge current $NI_{data}$ corresponding to N times the data current $I_{data}$ is applied to a data line $Y_j$ before the data current $I_{data}$ is applied to a pixel circuit 110 coupled to the data line $Y_j$ and a selection scan line $X_i$. Then, when the precharge current $NI_{data}$ is applied to the data line $Y_j$, a low level selection signal is applied to the pixel circuit 110 coupled to the selection scan line $X_i$ and to N−1 selection scan lines $X_{i+1} \sim X_{i+N-1}$ of the pixel circuit 110 adjacent to the pixel circuit in the column direction. Then, only the selection signal applied to the selection scan line $X_i$ is maintained at a low level, and the data current $I_{data}$ is applied to a data line $Y_j$. As such, the data line $Y_j$ is quickly precharged by the precharge current $NI_{data}$, which is larger than the data current $I_{data}$, and then the data current $I_{data}$ is applied to the data line $Y_j$. Thus, a voltage corresponding to the data current $I_{data}$ is quickly supplied to and charges the pixel circuit 110.

Hereinafter, referring to FIGS. 3, 4, 5A, and 5B, the operation of the light emitting display according to the first exemplary embodiment of the present invention will be described in detail. For ease of description, N is assumed to be 5, that is, the precharge current is assumed to be 5 times that of the data current.

First, pixel circuit 110 of the light emitting display according to the first exemplary embodiment of the present invention is described in detail with reference to FIG. 3.

Figure 3:
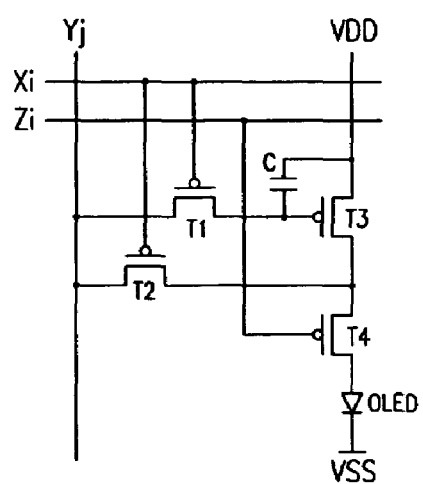
FIG. 3 is a simplified circuit diagram of a pixel circuit in a light emitting display according to the first exemplary embodiment of the present invention.

FIG. 3 is a simplified circuit diagram of a pixel circuit in a light emitting display according to the first exemplary embodiment of the present invention. FIG. 3 shows the pixel circuit coupled to the jth data line $Y_j$, the ith selection scan line $X_i$, and emitting scan line $Z_i$.

As shown, pixel circuit 110 according to the first exemplary embodiment of the present invention includes organic light emitting element OLED, transistors T1, T2, T3 and T4, and capacitor C. Transistors T1, T2, T3, and T4 are shown as PMOS transistors in FIG. 3, but transistor types of the present invention are not restricted to PMOS transistors. The transistors can be TFTs which have a gate electrode, a drain electrode, and a source electrode formed on the glass substrate of display panel 100 as a control electrode and two main electrodes, respectively.

In detail, the three electrodes (or terminals) of transistor T1 are respectively coupled to the selection scan line $X_i$, data line $Y_j$, and the gate of transistor T3. Transistor T1 transmits the data current $I_{data}$ provided by data line $Y_j$ to the gate of transistor T3 in response to the selection signal provided by selection scan line $X_i$. The source of transistor T3 is coupled to the supply voltage VDD, and capacitor C is coupled between the gate and source of transistor T3. Transistor T2 is coupled between the drain of transistor T3 and data lines $Y_j$, and transistors T1 and T2 diode-connect transistor T3 in response to the selection signal provided by selection scan lines $X_i$. Transistors T1 and T2 may be directly connected between the gate and drain of transistor T3.

At this point, data current $I_{data}$ is applied to data line Yi, and selection signal (select[1] in FIG. 4) provided by selection scan line $X_i$ is converted to low level. Transistors T1 and T2 are turned on, and transistor T3 is diode-connected. Then, data current $I_{data}$ is applied to and charges capacitor C, the gate voltage potential of transistor T3 is lowered, and current flows from the source to the drain of transistor T3. When the voltage charge on capacitor C is increased, and the drain current of transistor T3 increases so as to be the same as data current $I_{data}$, the charge on capacitor C is stopped, and the voltage charge on capacitor C is stabilized. Thus, a voltage corresponding to data current $I_{data}$ provided by data line $Y_j$ is charged on capacitor C.

Next, the selection signal (select [1] in FIG. 4) provided by the selection scan line $X_i$ is converted to a high level, and the emit signal (emit[1] in FIG. 4) provided by the emitting scan line Zi is converted to a low level. Then, transistors T1 and T2 are turned off, transistor T4 coupled between transistor T3 and the organic light emitting element OLED is turned on, and the current provided by transistor T3 is transferred to the organic light emitting element OLED. The cathode of the organic light emitting element OLED is coupled to a voltage source VSS which is lower than a supply voltage VDD, and the organic light emitting element OLED emits light in response to the current supplied via transistor T4. The current $I_{OLED}$ transmitted to the organic light emitting element OLED can be given in Equation 1 according to the voltage charged on capacitor C connected to transistor T3.

$$I_{OLED} = \frac{\beta}{2}(V_{GS} - V_{TH})^2 = I_{data} \qquad \text{Equation 1}$$

where $V_{GS}$ is the voltage between the gate and the source of transistor T3, VTH is a threshold voltage at transistor T3, and β is a constant.

Figure 5A:
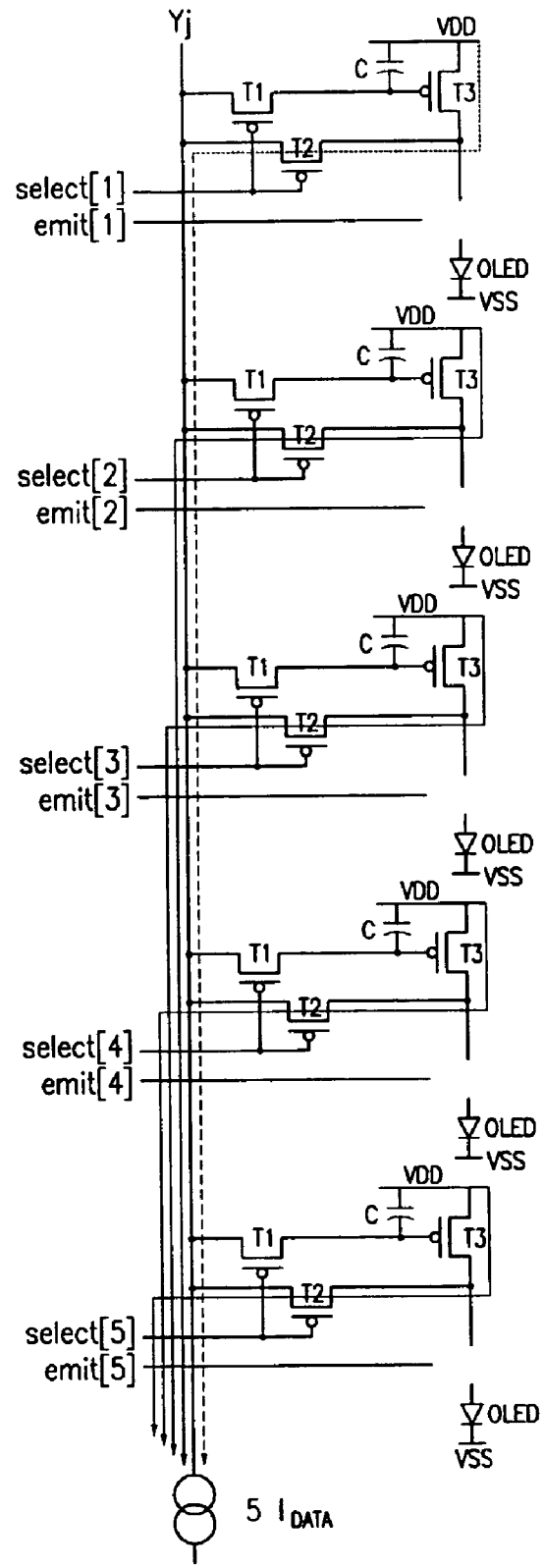
FIG. 5A shows a current supply state in the precharging stage.
Figure 5B:
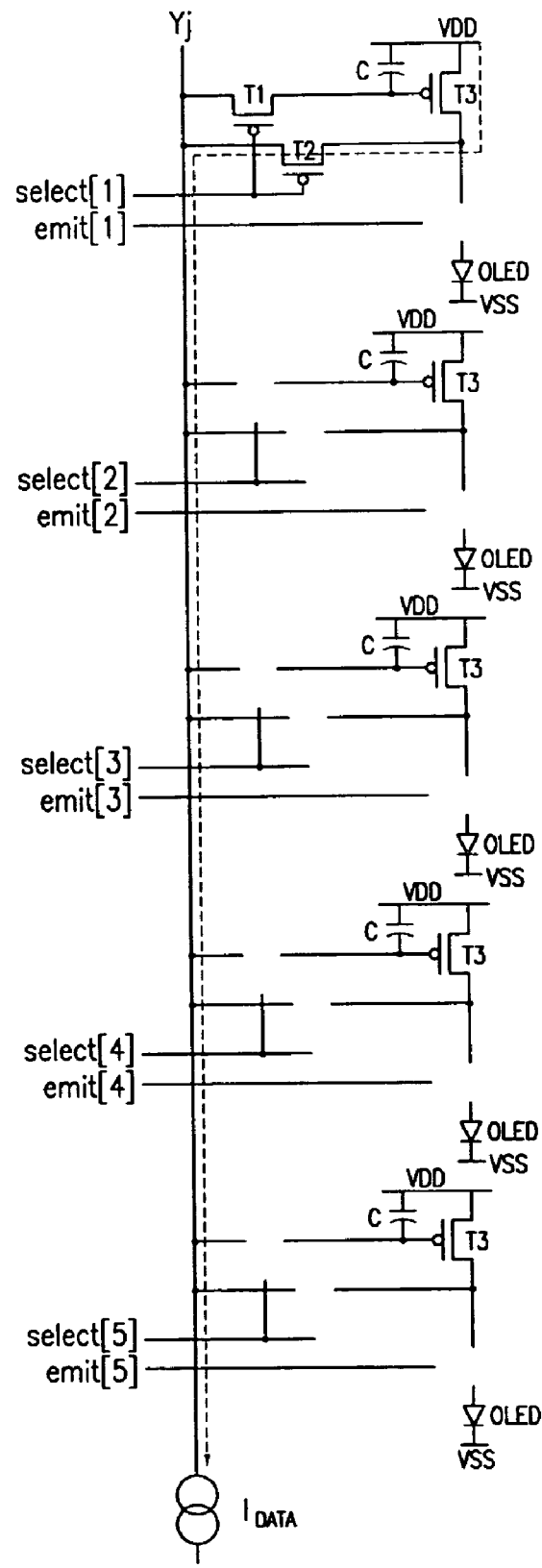
FIG. 5B shows a current supply state in the data programming stage.

Next, referring to FIGS. 4, 5A, and 5B, the operation of the light emitting display according to the first exemplary embodiment of the present invention will be further described in detail.

FIG. 4 is a driving timing diagram of a light emitting display according to the first exemplary embodiment of the present invention; FIG. 5A shows a current supply state in the precharging stage; and FIG. 5B shows a current supply state in the data programming stage. In FIGS. 5A and 5B, five pixel circuits coupled to the first selection scan line thru the fifth selection scan line $X_1$ to $X_5$ and the five emitting scan lines $Z_1$ to $Z_5$ are shown for convenience. In FIG. 4, and in FIGS. 5A and 5B, select[i] indicates a selection signal applied to the selection scan line $X_i$, and emit[i] indicates an emit signal applied to the emitting scan line $Z_i$. Reference numerals $X_i$ and $Z_i$ corresponding to the selection scan lines and the emitting scan lines are omitted.

As shown in FIG. 4, when the data is programmed in the pixel circuit coupled to the first selection scan line $X_1$, low level selection signals select[1] to select [5] are supplied to the first thru fifth selection scan lines $X_1$ to $X_5$, respectively. At the same time, data driver 200 applies the precharge current $5I_{data}$ to the data line $Y_j$ so as to perform a precharge operation during a precharge period Tp.

Transistors T1 and T2 of the pixel circuits 110 coupled to the selection scan lines $X_1$ to $X_5$ are turned on in response to the low level selection signals select[1] to select[5], and thus transistor T3 assumes a diode-connected state. As such, as shown in FIG. 5A, the precharge current $5I_{data}$ flows on the data line $Y_j$. At this point, when the ratio W/L (hereinafter, transistor size) of the channel width W and channel length L of transistors T3 in the five pixel circuits are the same, ⅕ of the precharge current $5I_{data}$ provided by the data line $Y_j$ is respectively supplied to the five pixel circuits. That is, the data current is supplied to each of the five pixel circuits. Then, the voltage $V_{GS}$ of Equation 1 is charged on capacitor C. That is, the precharge voltage from the gate voltage $V_G$ to the gate-source voltage $V_{GS}$ is applied to the data lines $Y_j$. However, when the precharge period Tp is short, the precharge voltage may not achieve a suitable voltage which should be applied to the data lines $Y_j$ by the data current $I_{data}$. However, the precharge voltage $5I_{data}$ is larger than the data current $I_{data}$, and thus a voltage corresponding to the data current $I_{data}$ can be applied to the data line $Y_j$ even though the precharge period Tp is short.

Next, as shown in FIG. 4, the selection signal select[1] applied to the first selection scan line $X_1$ is maintained at a low level, but the other selection signals select[2] to select[5] are changed to the high level. At the same time, data driver 200 applies the data current, the ⅕ of the precharge current $5I_{data}$, to the data line $Y_j$. Then, as shown in FIG. 5B, transistors T1 and T2 coupled to the first selection scan line $X_1$ are turned on, and the data current $I_{data}$ is transmitted to transistor T3. Thus, a voltage corresponding to the data current $I_{data}$ is charged on capacitor C of the pixel circuit coupled to the first selection scan line $X_1$ so as to perform the data programming operation. At this point, the precharge voltage (the voltage corresponding to the data current $I_{data}$) has been applied to the data line $Y_j$ by the previous precharge operation, and thus a voltage corresponding to the data current $I_{data}$ can be quickly charged on capacitor C.

Then, when the data programming operation is completed, the selection signal select[1] is turned to a high level, and transistor T4 is turned on by the low level of the emit signal emit[1] applied by the emitting scan line $Z_1$. Then, the current $I_{OLED}$ provided by transistor T3 is supplied to the organic light emitting element OLED through transistor T4, and the organic light emitting element OLED emits light corresponding to the current $I_{OLED}$.

As such, when the emit operation of the pixel circuit coupled to the first selection scan line $X_1$ is performed, the low levels of selection signals select[2] to select[6] are applied to selection scan lines X2 to X6, respectively. The precharge current $5I_{data}$ equal to 5 times the data current $I_{data}$, and corresponding to the pixel circuit coupled to the selection scan line X2, is applied to the data line $Y_j$ so as to perform a precharge operation on the pixel circuit coupled to the second selection scan line X2. Then, the selection signals select[3] to select[6] are converted to a high level after the precharge operation, and a data current $I_{data}$ corresponding to the pixel circuit coupled to the selection scan line X2 is applied to the data line $Y_j$ so as to perform the data programming operation on the pixel circuit coupled to the second selection scan line X2.

As such, in the first exemplary embodiment of the present invention, before data is programmed in a pixel circuit coupled to an ith selection scan line $X_i$, a precharge current $NI_{data}$ corresponding to 5 times the data current $I_{data}$ is applied to the pixel circuit when the selection signal is applied to the ith to (i+−1)th selection scan lines $X_i$ to $X_{i+N-1}$. Then, if the sizes of transistors T3 in pixel circuits arranged in the column direction are the same, a current corresponding to 1/N of the precharge current $NI_{data}$ is supplied to N pixel circuits coupled to the ith to (i+−1)th selection scan lines $X_i$ to $X_{i+N-1}$ so as to perform a precharge operation. Next, when the selection signal of the ith selection scan line $X_i$ is maintained at a low level, the selection signals of the (i+1)th to (i+−1)th selection scan lines $X_i$ to $X_{i+N-1}$ turn to a high level, while the data current $I_{data}$ is applied to the data line $Y_j$ so as to perform the data programming operation.

As such, the first exemplary embodiment of the present invention can program data in the pixel circuit by precharging a data line by means of a precharge current which is larger than the data current before the data is programmed. The data programming can be achieved in a predetermined period of time.

Hereinafter, with respect to the selection signal select[i] of FIG. 4, "precharge pulse" means a pulse that is of a low level only during a precharge period, and "selection pulse" means a pulse that is of a low level during a precharge period and a data programming period. Then, as shown in FIG. 4, a selection signal select[i] applied to the selection scan line $X_i$ has one selection pulse and at least one precharge pulse per cycle. In the selection signal select[i], the interval of start time points of two adjacent precharge pulses is the same as the interval of starting points of a selection pulse and a precharge pulse adjacent to the selection pulse. Furthermore, the selection signal select[i] has a number of precharge pulses corresponding to the number of pixels used in the precharge, excluding the pixel to which data is programmed. In addition, the precharge period Tp is the same as the width of the precharge pulse.

Hereinafter, a driver for generating the above driving waveform is described in detail with reference to FIG. 6 thru FIG. 25.

In the exemplary embodiments of the present invention, a selection signal is generated by combining an output signal from a shift register for generating a precharge pulse and an output signal from a shift register for generating a selection pulse. Hereinafter, a particular shift register for generating the precharge pulse is described in detail.

Furthermore, in exemplary embodiments of the present invention, the number of selection scan lines $X_1$ to $X_m$ is m, and a selection signal select[i] with four precharge pulses is described, if not particularly mentioned to the contrary. That is, four neighboring pixel circuits are used in the precharge of a pixel circuit for data programming.

Figure 6:
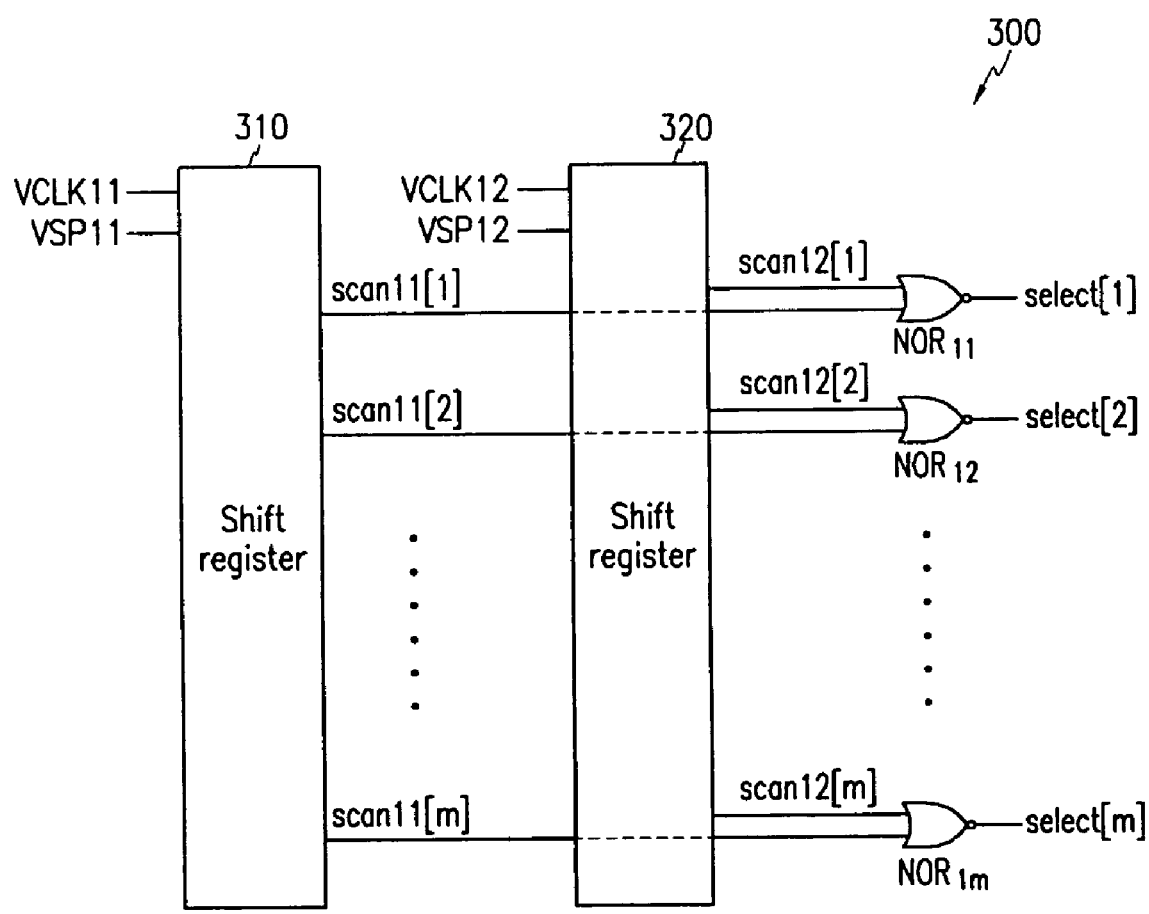
FIG. 6 shows a scan driver in a light emitting display according to a second exemplary embodiment of the present invention.
Figure 7:
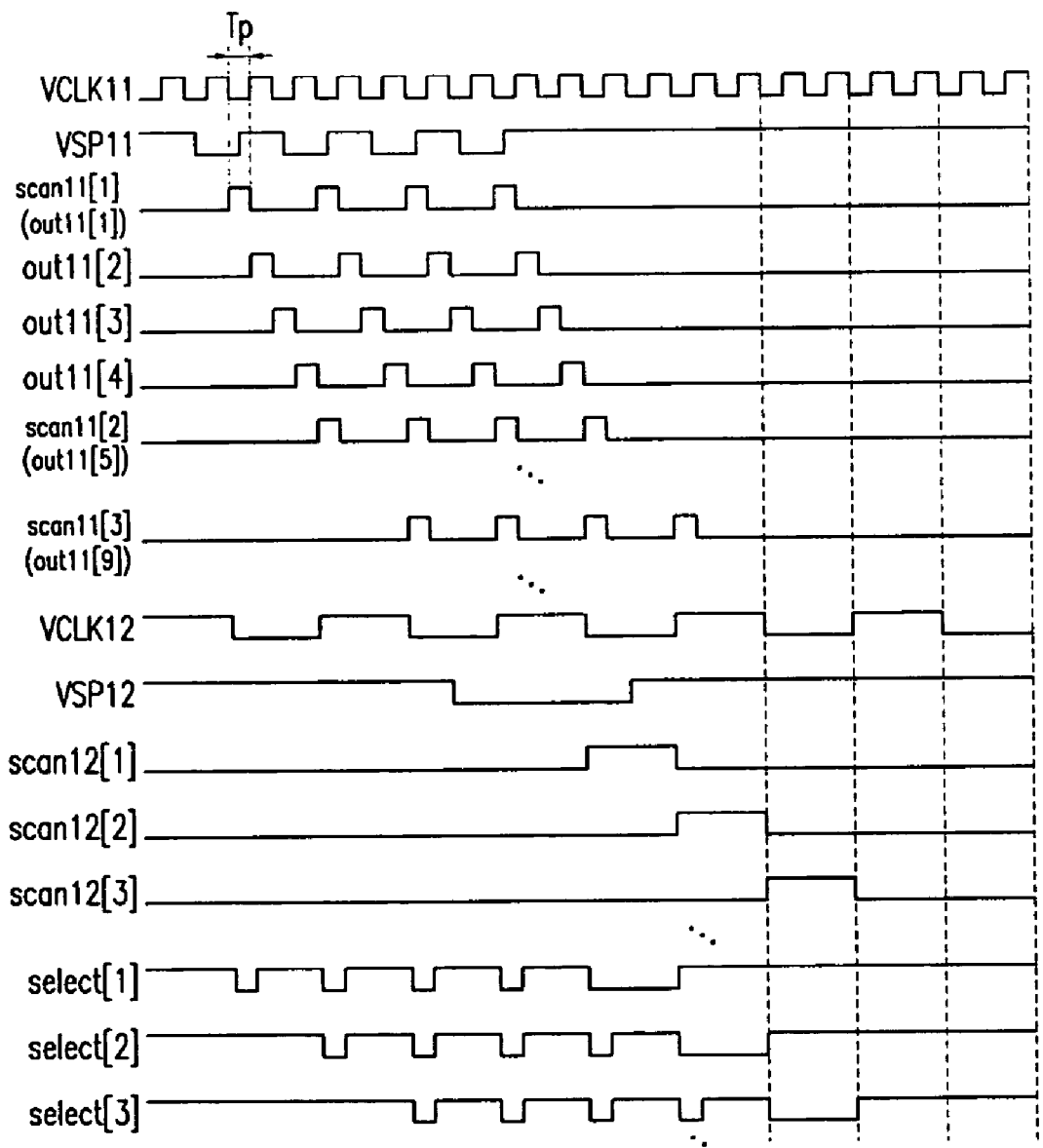
FIG. 7 is a signal timing diagram of a scan driver according to a third exemplary embodiment of the present invention.

FIG. 6 shows a scan driver in a light emitting display according to a second exemplary embodiment of the present invention, and FIG. 7 is a signal timing diagram of a scan driver according to a third exemplary embodiment of the present invention.

As shown in FIG. 6, scan driver 300 of the second exemplary embodiment of the present invention includes two shift registers 310 and 320, and m NOR gates NOR11 to NOR1m.

As shown in FIG. 6 and FIG. 7, shift register 310 receives clock signal VCLK11 and a starting signal VSP11, shifts output signals out11[1] to out11[4m−3] by half of a cycle of clock signal VCLK1, and sequentially provides the shifted output signals. The output signal out11[i] has four high level pulses in one cycle. The width of the high level pulse is the same as the half clock cycle of clock signal VCLK11, and the cycle of the high level pulse is twice the clock cycle of clock signal VCLK11. At this point, the precharge period Tp is determined by the width of the high level pulse. In addition, the (4i−3)th output signal out11[4i−3] of the output signals out11[1] to out11[4m−3] becomes an input signal scan11[i] of the ith NOR gate $NOR_{1i}$, i being an integer from 1 to m.

Shift register 320 receives clock signal VCLK12 and starting signal VSP12, shifts output signals scan12[1] to scan12[m] having one high level pulse by a half of a clock cycle of clock signal VCLK12, and sequentially provides the shifted output signals. The width of the high level pulse of the output signal scan12[i] is the same as the half clock cycle of clock signal VCLK12, and the clock cycle of clock signal VCLK12 is four times the clock cycle of clock signal VCLK11. A start time point of the high level pulse in the output signal scan12[i] is half of a clock cycle of clock signal VCLK12 away from a start time point of the last high level pulse in the output signal scan11[i].

NOR gate $NOR_{1i}$ performs a NOR operation on the output signal scan11[i] of shift register 310 and the output signal scan12[i] of shift register 320, and outputs the selection signal select[i]. The output signal select[i] of NOR gate $NOR_{1i}$ has a low level by virtue of the NOR operation when at least one of two output signals scan11[i] and scan12[i] has a high level. Thus, the output signal select[i] has four low level pulses (precharge pulse) and then one low level pulse (selection pulse) in one cycle as shown in FIG. 7. Thus, as shown in FIG. 4 and FIG. 7, the selection signal select[i] applied to the selection scan line $X_i$ can be generated as the output signal of the NOR gate $NOR_{1i}$.

Next, shift registers 310 and 320 for generating the output signals out11[i], scan11[i], and scan 12[i] explained in FIG. 6 and FIG. 7 are described with reference to FIGS. 8A to 13B.

Figure 8A:
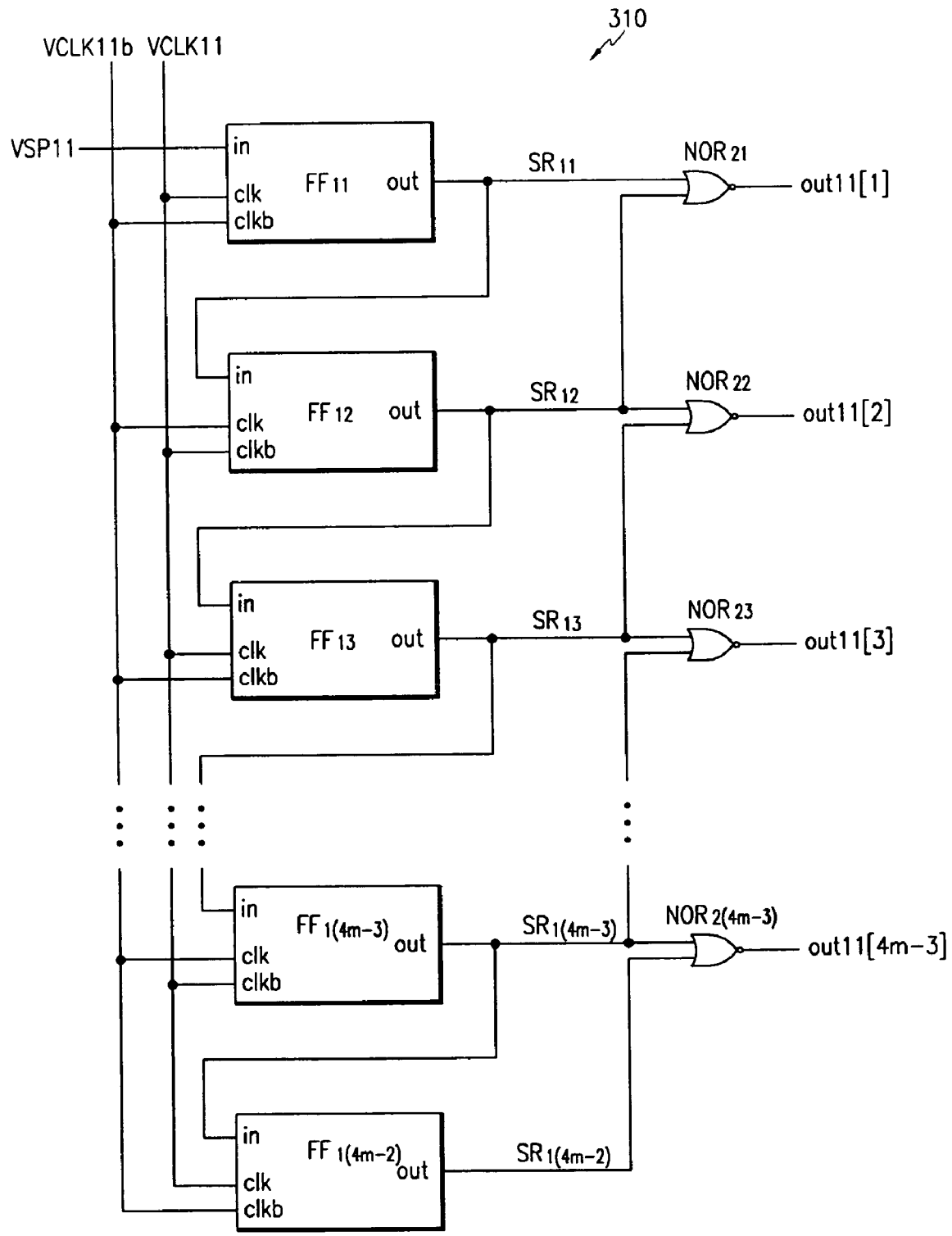
FIG. 8A is a simplified circuit diagram of a first shift register in the scan driver of FIG. 6.
Figure 8B:
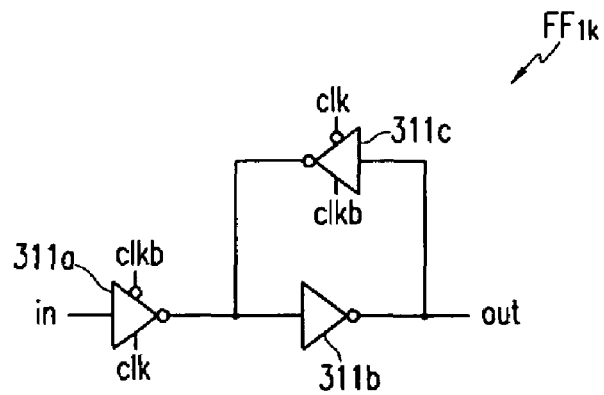
FIG. 8B is a simplified diagram of a flip-flop used in the shift register in FIG. 8A.
Figure 9:
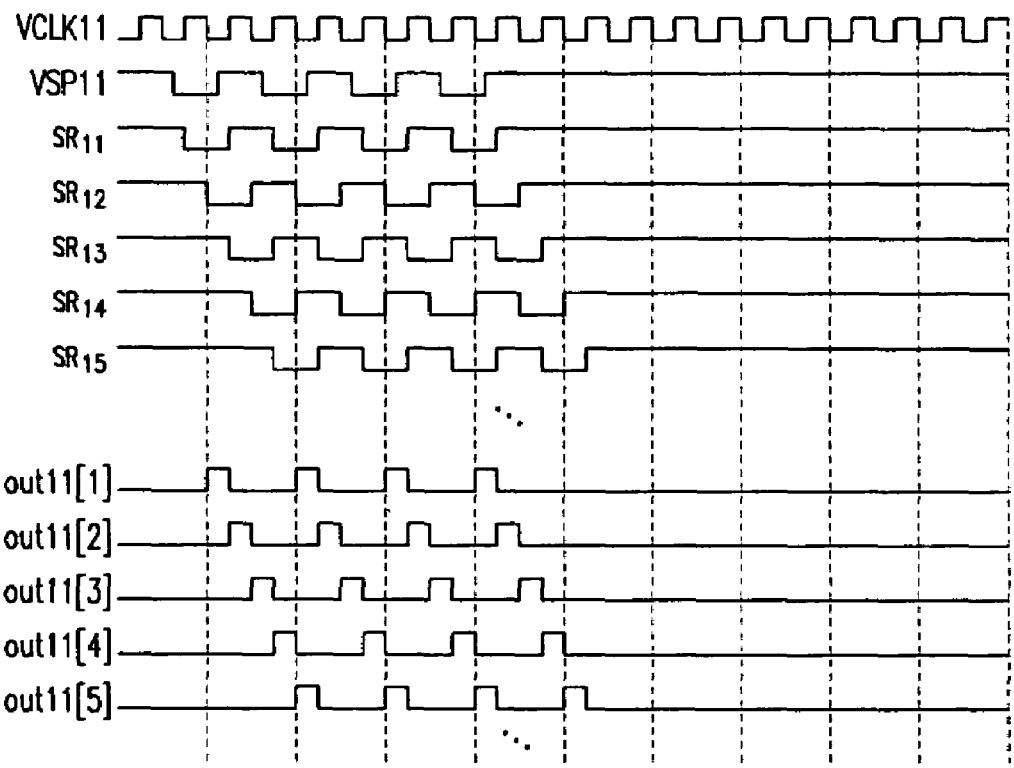
FIG. 9 is a timing diagram for an output signal of the flip-flop and an output signal of a NOR gate used in the shift register in FIG. 8A.

FIG. 8A is a simplified circuit diagram of a first shift register in the scan drive of FIG. 6, FIG. 8B is a simplified diagram of a flip-flop used in the shift register in FIG. 8A, and FIG. 9 is a timing diagram for an output signal of the flip-flop and an output signal of a NOR gate used in the shift register in FIG. 8A. More specifically, FIG. 8A is a simplified circuit diagram of shift register 310 in the scan driver of FIG. 6; FIG. 8B is a simplified diagram of a flip-flop used in the shift register in FIG. 8A; and FIG. 9 is a timing diagram for an output signal of the flip-flop and an output signal of the NOR gate used in the shift register of FIG. 8A. In FIGS. 8A and 8B, VCLK11b indicates an inverted clock signal VCLK11. However, VCLK11b is omitted in the signal timing diagram of FIG. 7 and FIG. 9.

As shown in FIG. 8A, shift register 310 includes (4m−2) flip-flops $FF_{11}$ to $FF_{1(4m-2)}$ and (4m−3) NOR gates $NOR_{21}$ to $NOR_{2(4m-3)}$. The output signals of each NOR gate $NOR_{2k}$ become the output signals out11[k] of shift register 310, k being an integer from 1 to (4m−3).

In FIG. 8A, the input signal of the first flip-flop $FF_{11}$ is the start signal VSP11 of FIG. 7 and FIG. 9, and the output signal $SR_k$ of the kth flip-flop $FF_{1k}$ is the input signal of the (k+1)th flip-flop $FF_{1(k+1)}$. The kth NOR gate $NOR_{2k}$ performs a NOR operation on the output signal $SR_{1k}$ of the kth flip-flop $FF_{1k}$ and the output signal $SR_{1(R+1)}$ of the (k+1)th flip-flop $FF_{1(R+1)}$ so as to generate the input signal out11[k].

The flip-flop $FF_{1k}$ outputs input signal in as it is inputted when clock clk is at a high level, but the flip-flop $FF_{1k}$ latches the input signal in inputted when the clock clk was at a high level, and outputs the resultant signal. Furthermore, the clock clk is inverted in the two adjacent flip-flops $FF_{1k}$ and $FF_{1(k+1)}$, and output signal $SR_{1(R+1)}$ of the flip-flop $FF_{1(k+1)}$ is the output signal $SR_{1k}$ of the flip-flop $FF_{1k}$ shifted by half of a clock cycle of clock signal VCLK1. That is, the clock signals VCLK1 and VCLK11b are inputted to the two flip-flops $FF_{1k}$ and $FF_{1(k+1)}$ in the opposite direction.

In detail, in FIG. 8A, the flip-flop $FF_{1k}$ which is located at an odd-numbered position in the column direction receives the clocks VCLK11 and VCLK11b as inner clocks clk and clkb, respectively. The flip-flop $FF_{1k}$ which is located at an even-numbered position in the column direction receives the clocks VCLK11 and VCLK11b as inner clocks clkb and clk, respectively. The starting signal VSP11, which is an input signal in of flip-flop $FF_{11}$, has four low level pulses in one cycle. The low level pulse corresponds to a high level of the clock VCLK11 per two clocks VCLK11 of the interval. Then, the flip-flops $FF_{11}$ to $FF_{1(4m-2)}$ can shift output signals $SR_1$ to $SR_{4m-2}$ having four low level pulses per cycle by half of a clock cycle of clock VCLK11, and sequentially output the output signals.

The kth NOR gate NOR2k performs a NOR operation on output signals $SR_k$ and $SR_{k+1}$ of the flip-flops $FF_{1k}$ and $FF_{1(k+1)}$, respectively, and thus the kth NOR gate NOR2k outputs a high level pulse when both output signals $SR_k$ and $SR_{k+1}$ are at a low level. The output signal $SR_{k+1}$ is the output signal $SR_k$ shifted by half of a clock cycle of clock VCLK11. Thus, as shown in FIG. 9, the output signal out11[k] of the NOR gate NOR2k has a high level pulse in half of a cycle of clock VCLK11. The output signal out11[k+1] of NOR gate $NOR_{2(k+1)}$ is the output signal out11[k] of NOR gate NOR2k shifted by half of a clock cycle of clock VCLK11. The (4i−3)th output signal out11[4i−3] of output signals out11[1] to out11[4m−3] of NOR gates NOR21 to NOR2(4m−3) is selected as a final output signal scan11[i] of shift register 310, i being an integer from 1 to m.

Next, referring to FIG. 8B, one example of flip-flop $FF_{1k}$ used in shift register 310 of FIG. 8A is described.

As shown in FIG. 8B, the flip-flop $FF_{1k}$ includes clock inverter 311a located at the input terminal, inverter 311b forming a latch, and clock inverter 311c. When clock clk is at a high level, clock inverter 311a inverts the input signal in and outputs the resultant signal, while inverter 311b inverts the output signal of clock inverter 311a and outputs the resultant signal. When clock clk is at a low level, the output of clock inverter 311a is cut off, the output of inverter 311b is inputted to clock inverter 311c, and the output of clock inverter 311c is inputted to inverter 311b to form a latch. Then, the output signal of inverter 311b becomes the output signal of the flip-flop $FF_{1k}$. As such, the flip-flop $FF_{1k}$ outputs the input signal in, as it is inputted when clock clk is at a high level, and the flip-flop $FF_{1k}$ latches the input signal in, inputted when the clock clk was at a high level, and outputs the resultant signal.

Figure 10:
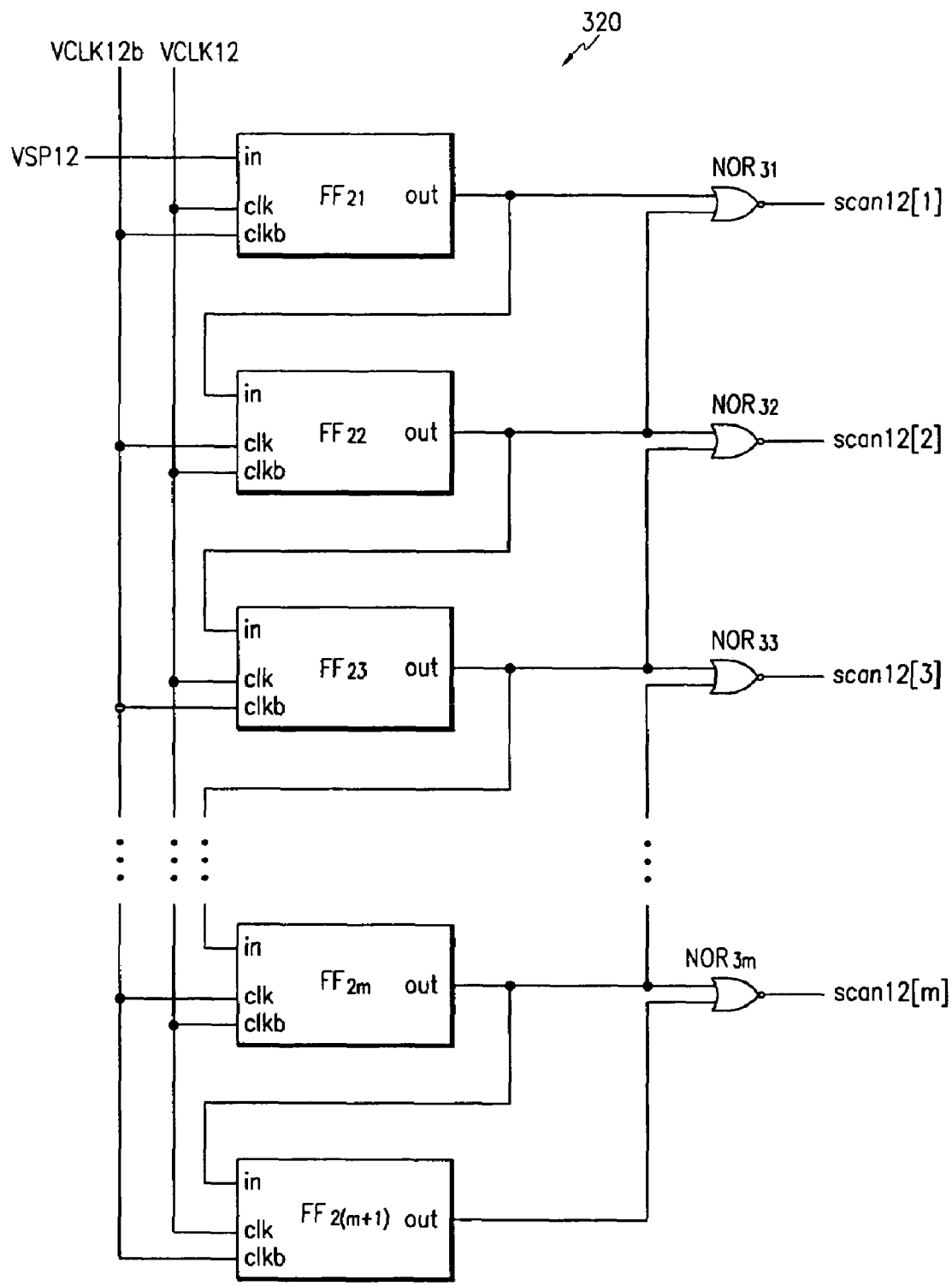
FIG. 10 is a simplified circuit diagram of a second shift register in the scan driver of FIG. 6.

Next, the construction and operation of shift register 320 of FIG. 6 is described with reference to FIG. 10, which is a simplified circuit diagram of a second shift register in the scan driver of FIG. 6. FIG. 10 shows a simplified circuit diagram of shift register 320. In FIG. 10, VCLK12b indicates an inverted signal of clock VCLK12. However, VCLK11b is omitted in the signal timing diagram of the FIG. 7.

As shown in FIG. 7, shift register 320 shifts a high level pulse by half of a clock cycle of clock VCLK12 and outputs the resultant signal, as does shift register 310. The high level pulse has a width of half of a clock cycle of clock VCLK12. Thus, a shift register having the same function as the shift register 310 can be used. Hereinafter, the difference between the two shift registers 310 and 320 is described. As shown in FIG. 7, the clock cycle of clock VCLK12 is four times the clock cycle of clock VCLK11.

As shown in FIG. 10, shift register 320 has the same construction as the shift register 310, excluding the number of flip-flops and NOR gates, as well as the start signal and clock used.

In detail, shift register 320 includes (m+1) flip-flops $FF_{21}$ to $FF_{2(m+1)}$, and m NOR gates $NOR_{31}$ to $NOR_{3m}$. An output signal of each NOR gate $NOR_{3i}$ becomes the output signal scan12[i] of shift register 320, i being an integer from 1 to m. An input signal of a first flip-flop $FF_{21}$ is a starting signal VSP12 of FIG. 7, and an output signal of the ith flip-flop $FF_{1i}$ becomes the input signal of the (i+1)th flip-flop $FF_{2(i+1)}$. The ith NOR gate $NOR_{3i}$ performs a NOR operation on the output signal of the ith flip-flop $FF_{2i}$ and the output signal of (i+1)th flip-flop FF2(i+1), and outputs the resultant signal scan12[i].

The flip-flop $FF_{2i}$ which is located at an odd-numbered position in the column direction in FIG. 10 receives the clocks VCLK12 and VCLK12b as inner clocks clk and clkb, respectively. The flip-flop $FF_{2i}$ which is located at an even-numbered position in the column direction receives the inverted clocks VCLK12 and VCLK12b as inner clocks clk and clkb, respectively. The starting signal VSP12 is established so as to have one low-level pulse when the clock VCLK12 is at a high level. Furthermore, a start time point of the high level pulse in the output signal scan12[i] is established so as to be half of a clock cycle of clock VCLK12 away from a start time point of the last high level pulse in the output signal scan11[i] of shift register 310. As such, shift register 320 shifts output signals scan12[1] to scan12[m] by half of a clock cycle of clock VCLK12 and outputs the resultant signal. The output signals scan12[1] to scan12[m] have a high level pulse, the cycle of which is half of a clock cycle of clock VCLK12.

The ith NOR gate $NOR_{1i}$ of scan driver 300 performs a NOR operation on the ith final output signal scan11[i] and the ith output signal scan12[i] of shift register 320, and outputs the resultant signal. Thus, the selection signal select[i] may include four precharge pulses and a selection pulse.

As such, in FIG. 6 thru FIG. 10, the width of the selection pulse is four times the width of a precharge pulse. However, scan driver 300 of FIG. 6 thru FIG. 10 may generate selection signals having different precharge pulse widths.

As mentioned above, the width of the precharge pulse is determined by the output of the flip-flop $FF_{1k}$, and thus a low level pulse of the output signal $SR_k$ of the flip-flop $FF_{1k}$ is assumed to have the narrowest width so as to lower the frequency of the clock VCLK11. That is, the width of the low level pulse of the output signal $SR_k$ of the flip-flop $FF_{1k}$ is assumed to be the same as the width of one clock cycle VCLK11.

Under the above assumption, a cycle of a low level pulse of the output signal $SR_k$ of the flip-flop $FF_{1k}$ is always n times the width, n being an integer of more than 2. Then, a cycle of a high level pulse in the output signal out11[k] of the NOR gate NOR2k becomes 2n times the width (that is, an even number of times more than 4). Thus, the width of the precharge pulse in the output signal scan11[i] is always ½n times the cycle. When a clock cycle of clock VCLK12 is 2n times a clock cycle of clock VCLK11, the width of selection pulse can be 2n times the width of the precharge pulse, and the interval by which the selection pulse is shifted may be the same as the cycle of the precharge pulse. The output signal out 11[k] of shift register 310 is shifted by half of a clock cycle of clock VCLK11 and is outputted. Thus, the total [2n×i−(2n−1)]th output signal out[2n×i−(2n−1)] is selected as the final output signal scan11[i] of shift register 310.

Next, an exemplary embodiment wherein the width of a selection pulse may be an even number of times, or less than at most 3 times, the width of a precharge pulse is described in detail with reference to FIG. 11 and FIG. 12.

Figure 11:
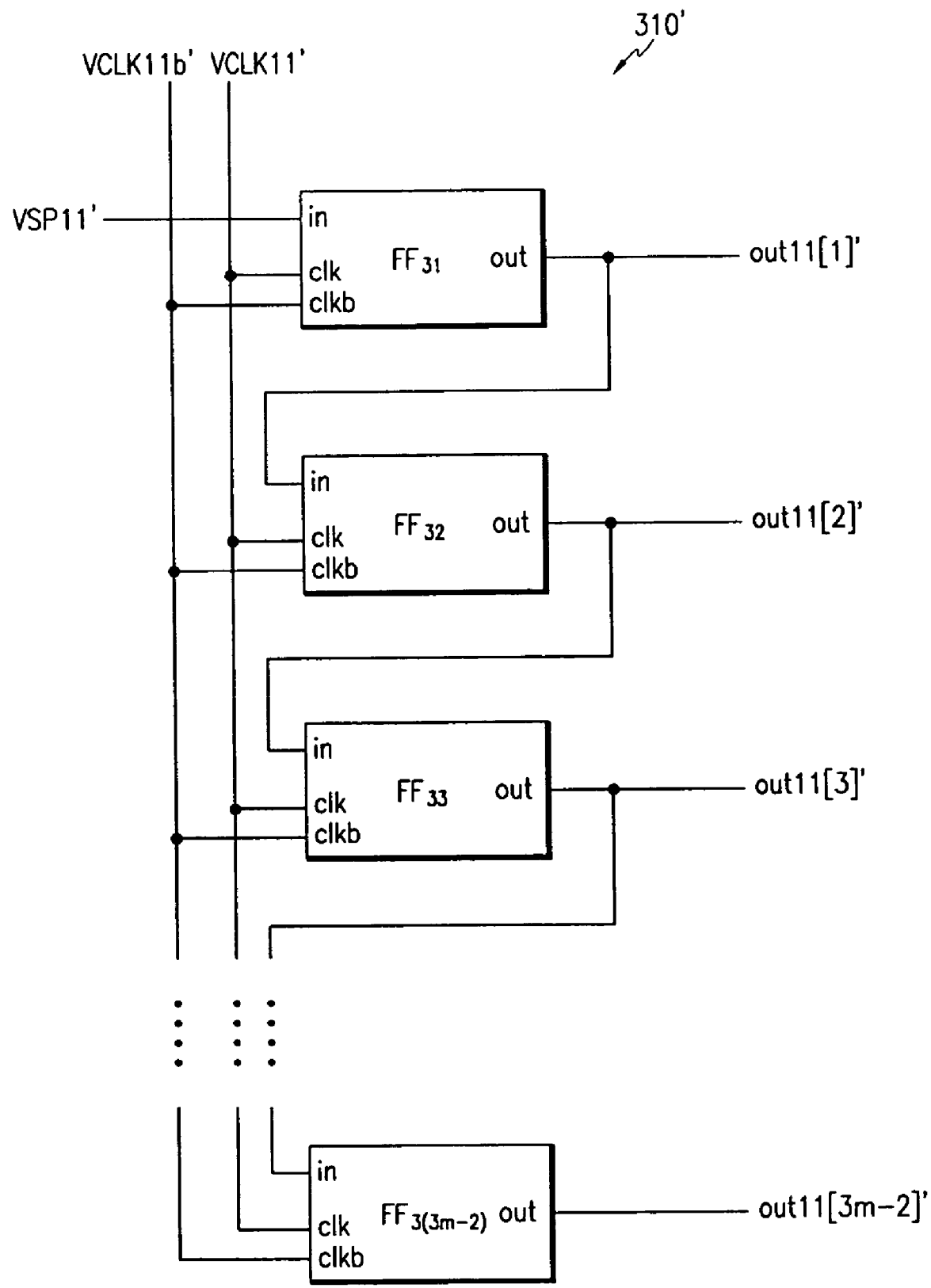
FIG. 11 is a simplified circuit diagram of a first shift register in the scan driver according to the third exemplary embodiment of the present invention.
Figure 12:
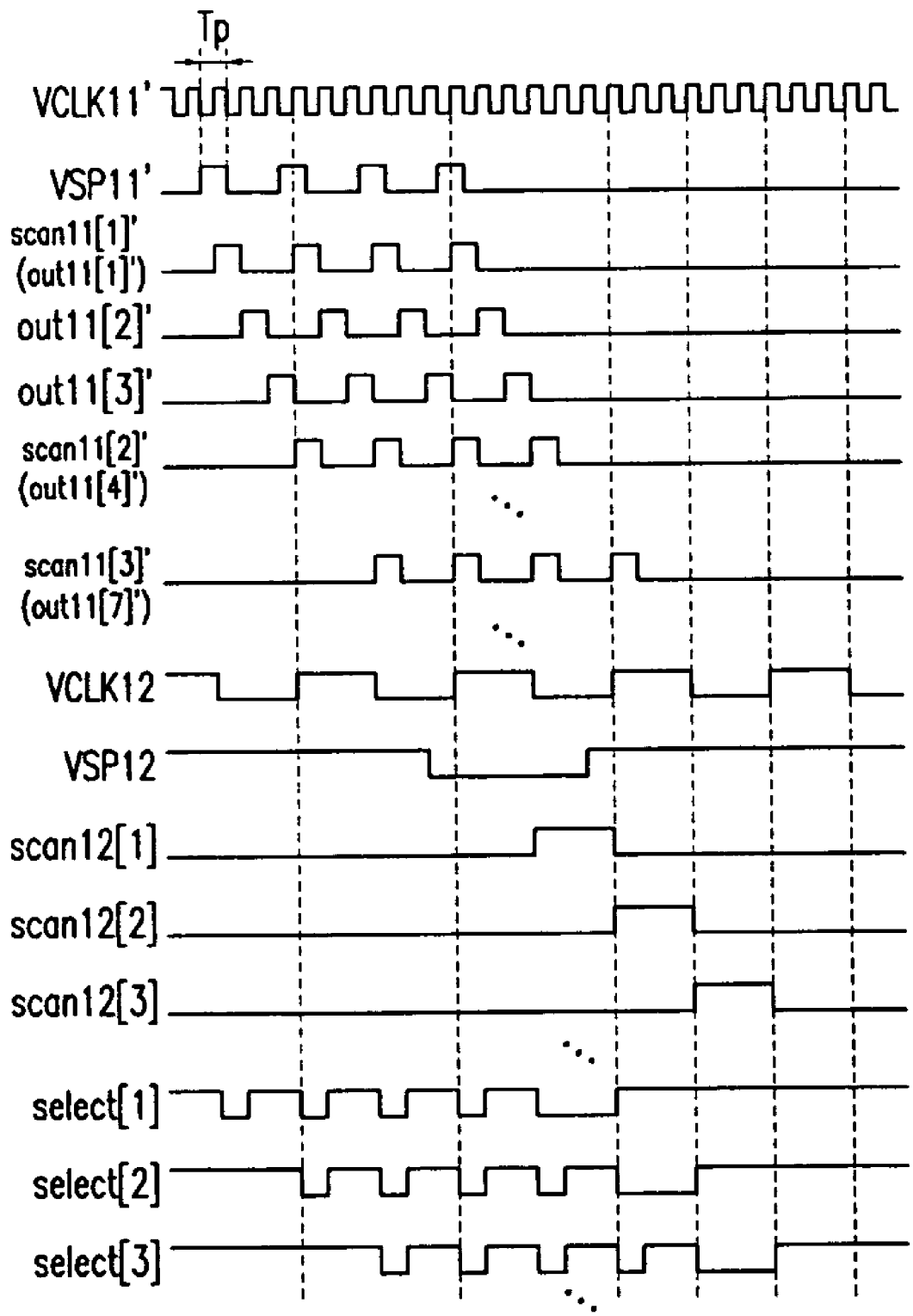
FIG. 12 is a signal timing diagram of the scan driver according to the third exemplary embodiment of the present invention.

FIG. 11 is a simplified circuit diagram of a first shift register in the scan driver according to the third exemplary embodiment of the present invention, and FIG. 12 is a signal timing diagram of the scan driver according to the third exemplary embodiment of the present invention. More specifically, FIG. 11 shows a simplified circuit diagram of shift register 310' according to a third exemplary embodiment of the present invention, and FIG. 12 shows a signal timing diagram of a scan driver according to the third exemplary embodiment. In FIG. 11, VCLK11b' indicates an inverted signal of clock VCLK11'. However, VCLK11b' is omitted in the signal timing diagram of FIG. 12. Furthermore, for ease of description, a cycle of the precharge pulse is three times the width in the third exemplary embodiment of the present invention. The construction and operation of shift register 320 and NOR gates $NOR_{11}$ to $NOR_{1m}$ may be the same as those in the second exemplary embodiment, and thus the descriptions for those are omitted here.

As shown in FIG. 11, shift register 310' includes (3m−2) flip-flops $FF_{31}$ to $FF_{3(3m-2)}$. Output signals of each of the flip-flops $FF_{31}$ to $FF_{3(3m-2)}$ become the output signals out11 [1]' to out11[3m−2]' of shift register 310'.

The flip-flop $FF_{3k}$ receives the clock signals VCLK11' and VCLK11b' as inner clocks clk and clkb, respectively. The flip-flop $FF_{3k}$ receives an input signal when clock clk is at a low level, while the flip-flop $FF_{3k}$ outputs an input signal latched in a previous clock clk cycle. The flip-flop $FF_{3k}$ latches the signal inputted at a low level, and outputs the resultant signal when clock clk is at a high level. As a result, the flip-flop $FF_{3k}$ delays the signal inputted at a low level of clock clk by half of a clock cycle of clock clk, and outputs the resultant signal during one clock cycle of clock clk.

As shown in FIG. 12, the output signal out11[1]' of the flip-flop FF31 has four high level pulses per cycle. The width of the high level pulse is the same as a clock cycle of clock VCLK11', and the cycle is three times the width. A start signal VSP11', which is an input signal in of the flip-flop FF31, has three high level pulses per cycle. This high level pulse corresponds to a low level of clock VCLK11' per three clocks VCLK11'. Then, the flip-flop $FF_{3k}$ shifts the output signal out11 [k]∝ having four high level pulses per cycle by one clock cycle of clock VCLK11', and sequentially outputs the resultant signals. The (3i−2)th output signal out11[3i−2]' of output signals out11[k]' of the flip-flop $FF_{3k}$ is selected as the final output signal scan11[i]', i being an integer from 1 to m.

As such, when the width of the high level pulse is established to be one clock cycle of clock VCLK11' in the output signal scan11[i]' of shift register 310', a cycle of the high level pulse can be established to be more than twice the width of the high level pulse (three times in FIG. 12). Since the high level pulse corresponds to a precharge pulse in the output signal scan11[i]', the width Tp of the precharge pulse is always 1/n times (⅓ times in FIG. 11) the cycle, n being an integer of more than 2. When a clock cycle of clock VCLK12 of the shift register 320 is established to be 2n times (six times in FIG. 11) the clock VCLK11' of shift register 310', the width of the selection pulse may be n times (three times in FIG. 11) the width of the precharge pulse, while the selection pulse may be shifted by an interval of the cycle of the precharge pulse.

When a cycle of the high level pulse is n times the width in output signal out11[k]' of shift register 310', a total of [n×m−(n−1)] output signals out11[k]' are required in shift register 310'. The [n×i−(n−1)]th output signal outl[n×i−(n−1)]' of the latter output signals becomes the final output signal scan11[i] of shift register 310'.

As such, when the cycle of the precharge pulse is established to be an odd number of times or less than 3 times the width, shift register 310' can be used according to the third exemplary embodiment. Shift register 310', according to the third exemplary embodiment, can be used when the cycle of the precharge pulse is an even number of times of more than four times the width. However, its construction becomes complicated and the frequency of the clock VCLK11' is increased in comparison with shift register 310 as described in the second exemplary embodiment.

Next, one example of a flip-flop used in the shift register of FIG. 11 is described with reference to FIGS. 13A and 13B.

Figure 13A:
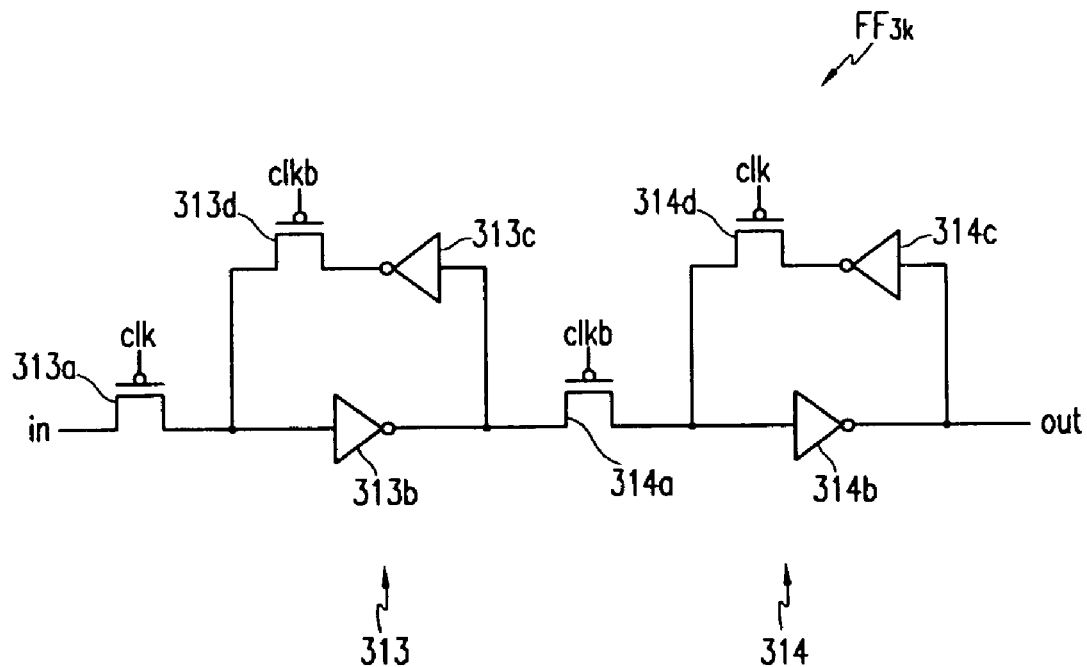
FIGS. 13A and 13B show respective simplified diagrams of the flip-flops used in the shift register of FIG. 11.
Figure 13B:
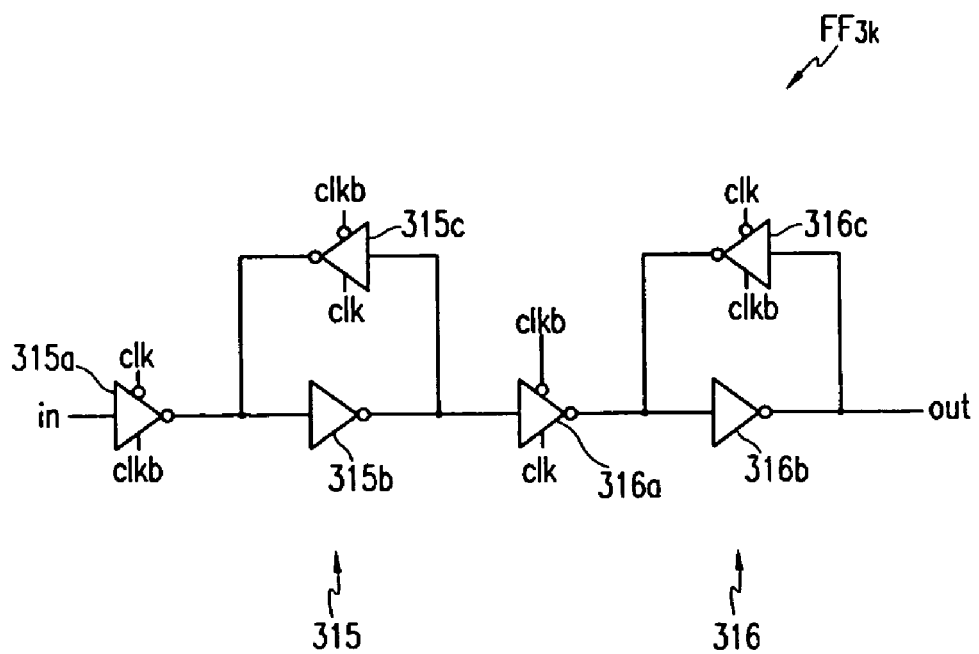

FIGS. 13A and 13B show respective simplified diagrams of the flip-flops used in the shift register of FIG. 11. The flip-flop $FF_{3k}$ of FIG. 13A and FIG. 13B is formed as a master/slave type of latch. Clocks VCLK11' and VCLK11b' are inputted to inner clocks clk and clkb, respectively, of the flip-flop $FF_{3k}$.

As shown in FIG. 13A, in master latch 313, PMOS transistor 313a located in the input terminal transfers the input signal in to inverter 313b in response to a low level of one clock cycle of clock clk, and inverter 313b inverts the output signal of PMOS transistor 313a and outputs the resultant signal as an output signal of master latch 313. Furthermore, inverter 313c inverts the output signal of inverter 313b, and outputs the resultant signal. PMOS transistor 313d transfers the output signal of inverter 313c to inverter 313b in response to a low level of the clock clk, that is, a high level of one clock cycle clkb. In other words, master latch 313 inverts the input signal inputted during a low level of the clock clk, and outputs the resultant signal during one clock cycle of clock clk.

Next, in slave latch 314, PMOS transistor 314a located at the input terminal transfers the output signal of master latch 313 to inverter 314b in response to a low level of an inverted clock clkb, and inverter 314b inverts the output signal of PMOS transistor 314a and outputs the resultant signal as an output signal of slave latch 314. Furthermore, inverter 314c inverts the output signal of inverter 314b and outputs the resultant signal, and PMOS transistor 314d transfers the output signal of inverter 314c to inverter 314b in response to a low level of the clock clk. That is, slave latch 314 inverts the output signal of master latch 313 during a high level of the clock clk, and outputs the resultant signal during one clock cycle of clock VCLK1.

Therefore, the flip-flop $FF_{3k}$ of FIG. 13A may delay the input signal inputted during a low level of the clock VCLK11' by half of a clock cycle of clock VCLK11', and outputs the resultant signal during one clock cycle of clock VCLK11'.

In contrast with FIG. 13A, a master and a slave of the flip-flop $FF_{3k}$ may be formed with the same construction as the flip-flop of FIG. 8B, as shown in FIG. 13B. At this time, master latch 315 uses the clocks clk and clkb in a method contrasted with the flip-flop in FIG. 98B, and slave latch 316 uses the clocks clk and clkb in the same method as the flip-flop in FIG. 8B.

Master latch 315 outputs the input signal in inputted during a low level of the clock clk during one clock cycle, and slave latch 316 outputs the output signal of master latch 315 during a high level of the clock clk during one clock cycle of clock clk. Thus, the flip-flop $FF_{3k}$ of FIG. 13B delays the input signal in during a low level of the clock VCLK11' by half of a clock cycle of clock VCLK11', and outputs the resultant signal during one clock cycle of clock VCLK11'.

As explained above, scan drivers 300 according to the second and third exemplary 18 embodiments shift a first output signal having a high level pulse corresponding to the precharge 19 pulse by an interval corresponding to the width of the high level pulse, and sequentially output the resultant signal. Scan drivers 300 select a signal shifted by a predetermined interval 21 corresponding to the cycle of the high level pulse of the first output signals, and use the signal as the precharge pulse.

Figure 14:
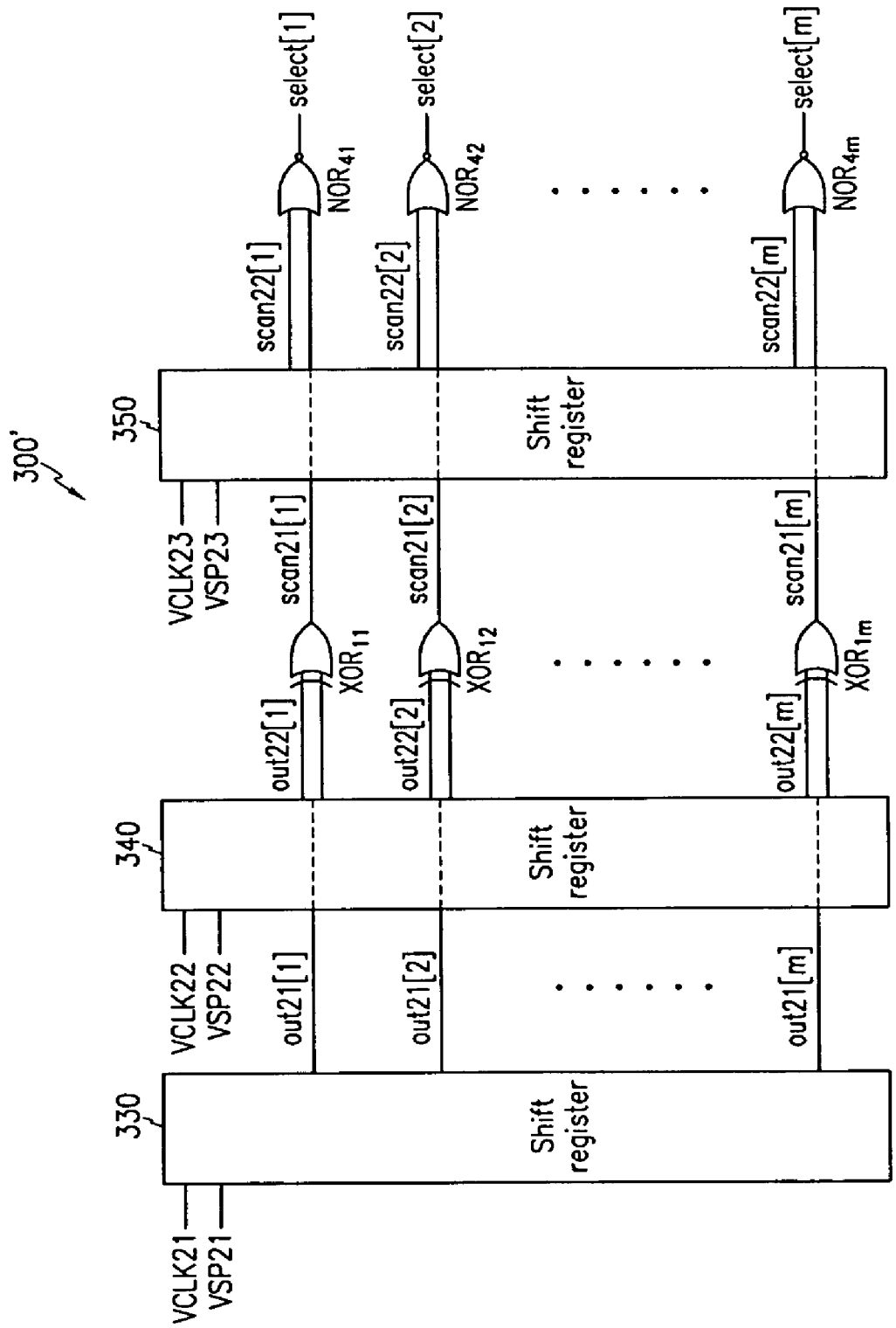
FIG. 14 shows a scan driver according to a fourth exemplary embodiment of the present invention.
Figure 15:
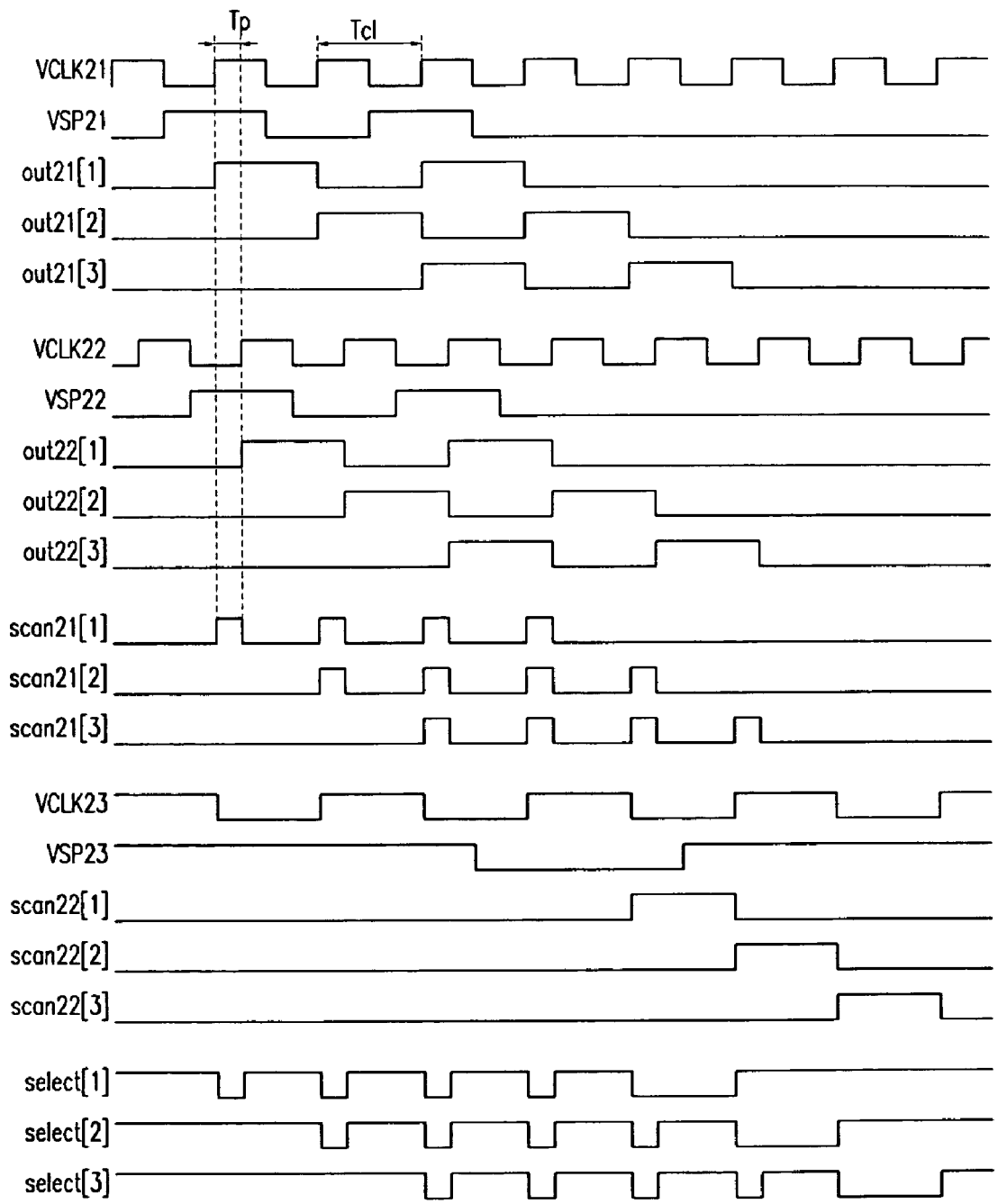
FIG. 15 is a signal timing diagram of the scan driver according to the fourth exemplary embodiment of the present invention.

FIG. 14 shows a scan driver according to a fourth exemplary embodiment of the present invention, and FIG. 15 is a signal timing diagram of the scan driver according to the fourth exemplary embodiment of the present invention.

As shown in FIG. 14, scan driver 300' according to the fourth exemplary embodiment includes: three shift registers 330, 340, and 350; a plurality of XOR gates $XOR_{11}$ to $XOR1m$; and a plurality of NOR gates NOR41 to NOR4*m*.

As shown in FIG. 14 and FIG. 15, shift register 330 receives a clock signal VCLK21 and a starting signal VSP21, shifts output signals out21[1] to out21[m] by one clock cycle of clock VCLK21, and sequentially outputs the resultant signal. The output signal out21[i] includes two high level pulses in one cycle. In the high level pulse, its width is the same as a period Tc1 of the clock VCLK21, and its period is twice the period Tc1 of the clock VCLK21, i being an integer from 1 to m.

Shift register 330 receives a clock signal VCLK22 and a starting signal VSP22, and shifts output signals out22[1] to out22[m] by one cycle of clock VCLK22, and sequentially outputs the resultant signal. The clock VCLK22 has the same cycle Tc1 as the clock VCLK21, and is the signal for the clock VCLK21 to be shifted by the precharge period Tp. The output signal out22[i] also has two high level pulses in one cycle. The width of the high level pulse is the same as the clock cycle of clock VCLK22, and the cycle of the high level pulse is twice the clock cycle of clock VCLK22, i being an integer from 1 to m. The output signal out22[i] of shift register 340 is the signal for the output signal out21[i] of shift register 330 to be shifted by the precharge period Tp.

Each XOR gate $XOR_{1i}$ performs an XOR operation on the output signal out21[i] of shift register 330 and the output signal out22[i] of shift register 340, and outputs the resultant output signal scan21[i]. The output signal scan21[i] assumes a high level when one of the two output signals out21[i] and out22[i] is at a high level by virtue of the XOR operation. Since the output signal out22[i] is the signal for the output signal out21 [i] to be shifted by the precharge period Tp, the output signal scan21[i] has four high level pulses in one cycle when the precharge period Tp is shorter than one clock cycle of clock VCLK21. The output signal scan21[i+1] of the XOR gate XOR1(i+1) becomes a signal for the previous output signal scan21[i] to be shifted by one clock cycle of clock VCLK21, and three of four high level pulses of the output signal scan21[i+1] correspond to the high level pulses of the output signal scan21[i].

Shift register 350, like shift register 320 of FIG. 6, receives a clock signal VCLK23 and a starting signal VSP23, shifts the output signals scan22[1] to scan22[m] having the high level pulse by half of a clock cycle of clock VCLK23, and sequentially outputs the resultant signals. The clock cycle of clock VCLK23 is twice the clock cycle of clock VCLK21. The start time point of the high level pulse in the output signal scan22[i] is half of a clock cycle of clock VCLK21 away from a start time point of the last high level pulse in the output signal scan21[i].

NOR gate NOR4i performs a NOR operation on the two output signals scan21[i] and scan22[i], and outputs a selection signal select[i] as does NOR gate $NOR_{1i}$ of FIG. 6. The width and cycle of the precharge pulse are the same as the width and cycle, respectively, of the high level pulse of the output signal scan21[i], and the width of the selection pulse is the same as the width of the high level pulse of the selection signal scan2[i]. Thus, as shown in FIG. 4 and FIG. 15, the selection signal select[i] applied to a selection scan line $X_i$ can be generated from the output signal of NOR gate $NOR_{4i}$.

Next, shift registers 330, 340, and 350 for generating the output signals out21[i], out22[i], and scan22[i], respectively, explained in FIG. 14 and FIG. 15, are described in detail with reference to FIG. 16.

Figure 16:
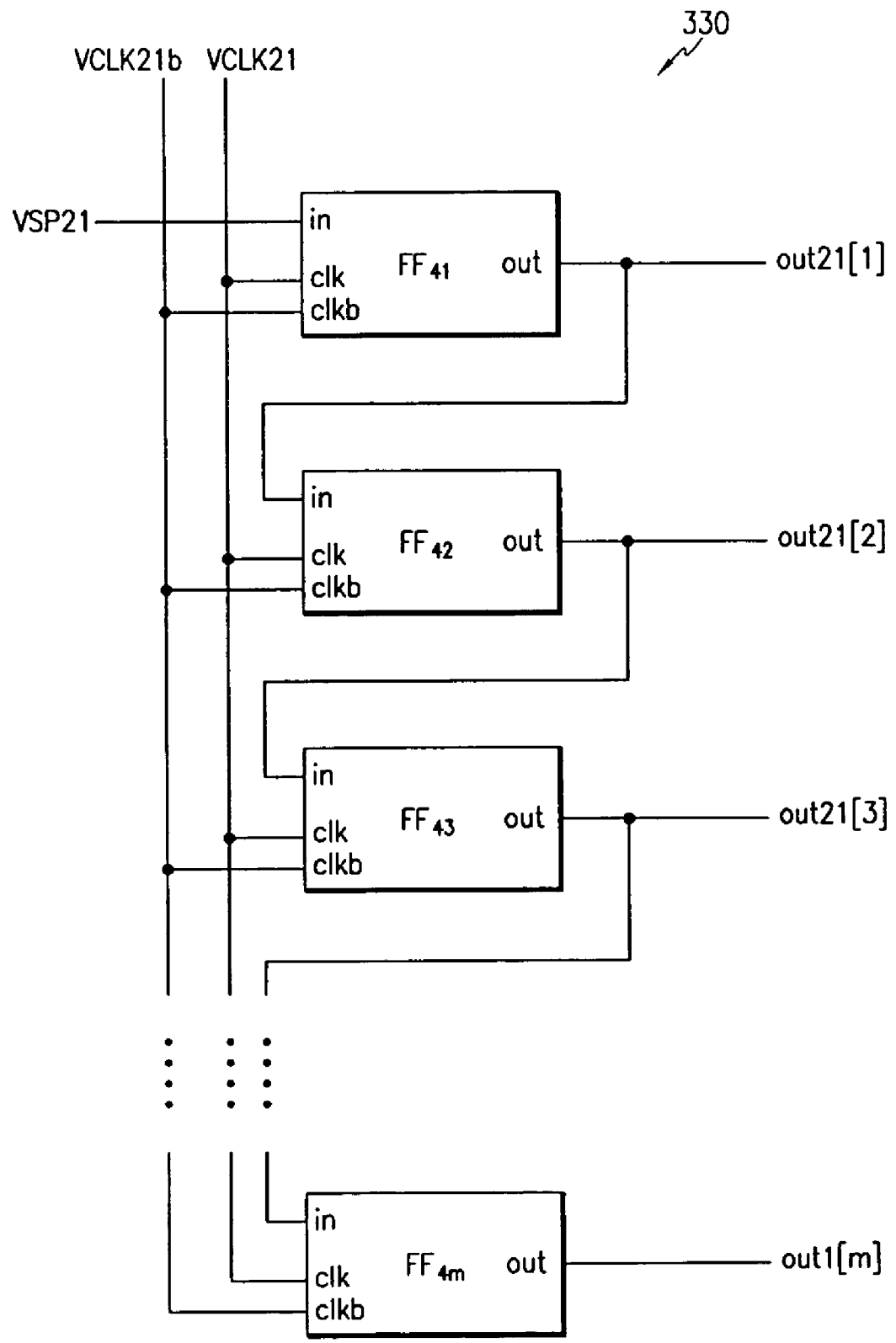
FIG. 16 is a simplified circuit diagram of a first shift register in the scan driver of FIG. 14.

FIG. 16 is a simplified circuit diagram of a first shift register in the scan driver of FIG. 14. More specifically, FIG. 16 is a simplified circuit diagram of the shift register 330 of FIG. 14. VCLK21b indicates an inverted version of clock signal VCLK21 in FIG. 16. Shift registers 330 and 340 have the same types of output signals, and thus they may have the same construction or shift register. Thus, hereinafter, the shift register 330 is mainly described.

As shown in FIG. 16, shift register 330 of FIG. 16 includes m flip-flops $FF_{41}$ to $FF_{4m}$, and the output signal of each flip-flop $FF_{4i}$ become the output signal out21[i] of shift register 330, i being an integer from 1 to m.

In FIG. 16, an input signal of a first flip-flop $FF_{41}$, is the starting signal VSP21 of FIG. 15, and an input signal in of the (i+1)th flip-flop $FF_{4(i+1)}$ is the output signal out21[i] of the ith flip-flop $FF_{4i}$. The flip-flop $FF_{4i}$ receives the clock signal VCLK21 and VCLK21b as inner clocks clk and clkb, respectively. The flip-flop $FF_{4i}$ delays the signals inputted during a low level of the clock clk by half of a clock cycle of clock clk and outputs the resultant signal, as do the flip-flops described in FIGS. 11, 13A, and 13B.

As shown in FIG. 15, the output signal out21[i] of the flip-flop FF4i has two high level pulses in one cycle, the width of the high level pulse is the same as the clock cycle VCLK21, and the cycle of the high level pulse is twice the clock cycle of clock VCLK21. The starting signal VSP21 and the input signal in of the flip-flop $FF_{41}$ have two high level pulses in one cycle, and the high level pulses correspond to the low level of the clock VCLK21 per two clock intervals of clock VCLK21. The flip-flops $FF_{41}$ to $FF_{4m}$ shift the output signals out21[1] to out21[m] having two high level pulses by one clock cycle of clock VCLK21, and sequentially output the resultant signal.

Further, shift register 340 has the same construction as shift register 330, the clock signal VCLK22 and the starting signal VSP22 are signals that represent the clock signal VCLK21 and the starting signal VSP21, respectively, shifted by the precharge period (Tp), and they are inputted to shift register 340. Then, as shown in FIG. 15, shift register 340 sequentially outputs the signal out22[i] such that the output signal out21[i] is shifted by the precharge period (Tp).

As shown in FIG. 7 and FIG. 14, the output signal scan22[i] of shift register 350 is the same as the output signal scan12[i] of shift register 320 in FIG. 10. Thus, when the clock signal VCLK23 and a starting signal VSP23 of FIG. 14 are inputted to shift register 320 in FIG. 10, the output signal scan22[i] of shift register 350 can be generated.

Furthermore, other numbers of precharge pulses, in addition to four, may be generated by applying scan driver 300' of the fourth exemplary embodiment.

For example, when the precharge pulse is 2n, n high level pulses may be generated in the output signals out21[i] and out22[i] of shift registers 330 and 340, and the cycle of the high level pulse may be twice the width. In particular, when the precharge pulses are two, scan driver 300' can be embodied by the shift register 320 of FIG. 10. Hereinafter, such an exemplary embodiment is described with reference to FIG. 17 and FIG. 18.

Figure 17:
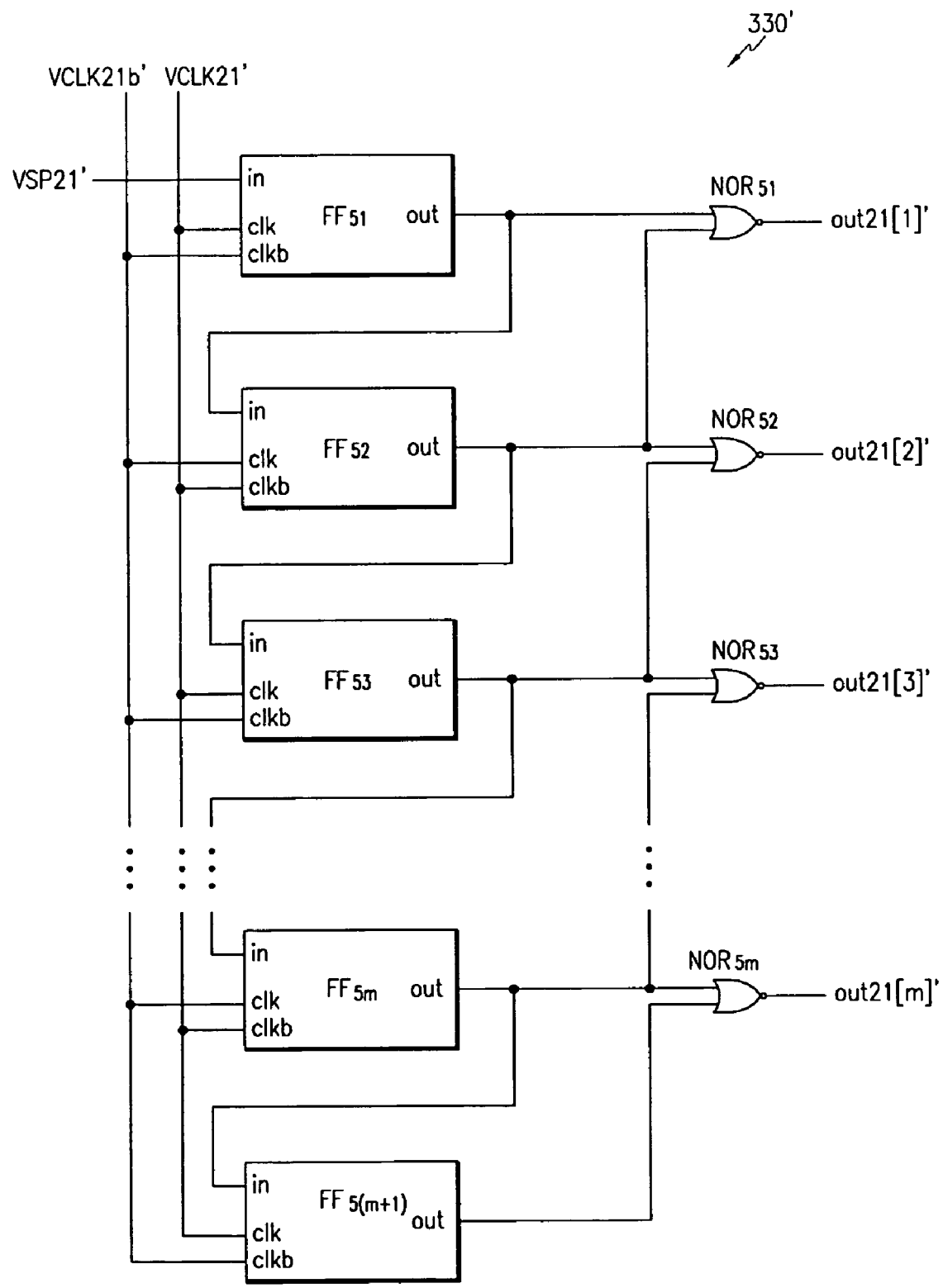
FIG. 17 is a simplified circuit diagram of a first shift register in the scan driver according to a fifth exemplary embodiment of the present invention.
Figure 18:
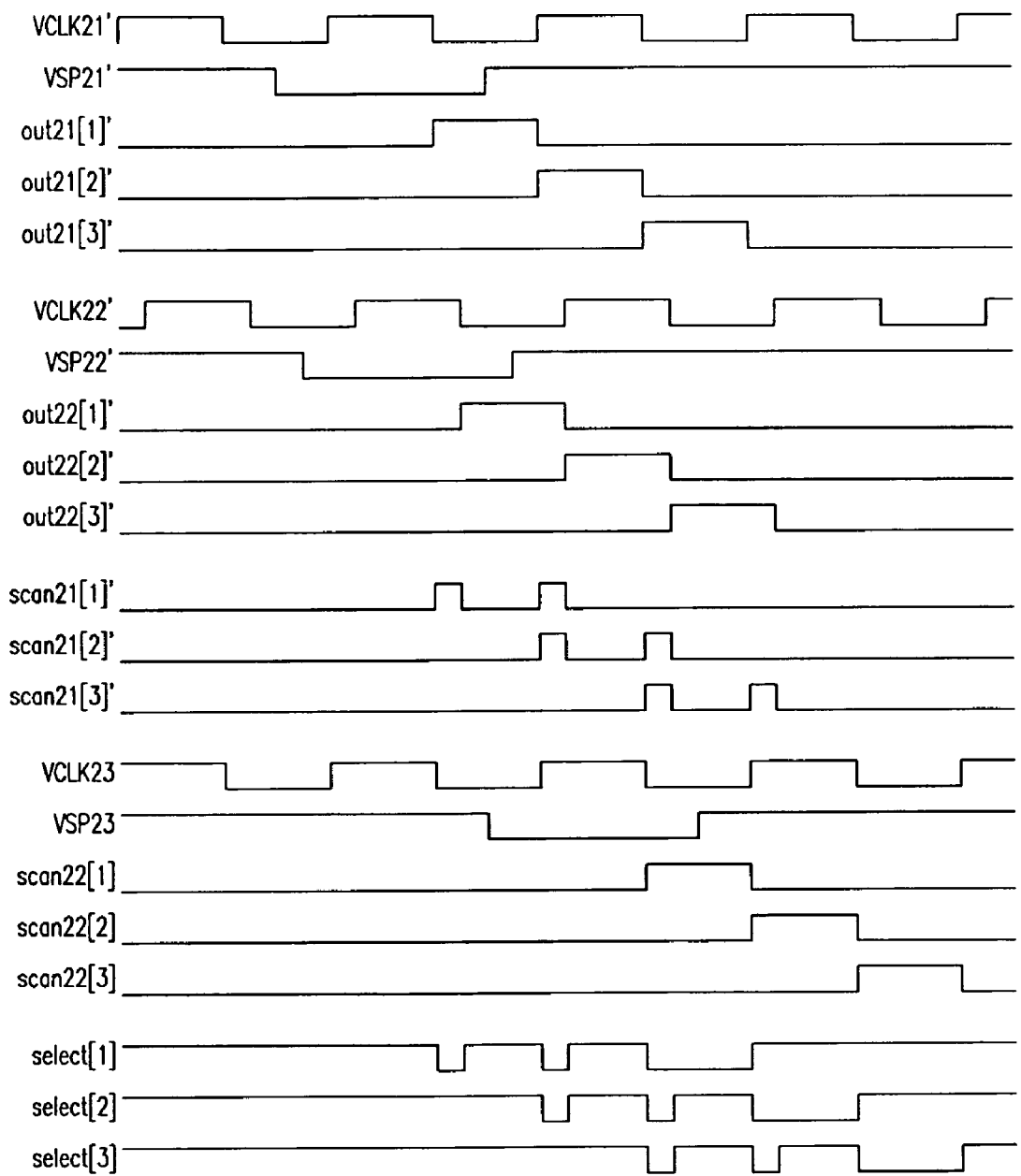
FIG. 18 is a signal timing diagram of the scan driver according to the fifth exemplary embodiment of the present invention.

FIG. 17 is a simplified circuit diagram of a first shift register in the scan driver according to a fifth exemplary embodiment of the present invention, and FIG. 18 is a signal timing diagram of the scan driver according to the fifth exemplary embodiment of the present invention. In FIG. 17 and FIG. 18, out21[i]', VCLK21' and VSP21' indicate an output signal, a clock signal and a starting signal, respectively, of shift register 330', and out22[i]', VCLK22', and VSP22' indicate an output signal, a clock signal and a starting signal, respectively, of shift register 340, i being an integer from 1 to m.

As shown in FIG. 17, shift register 330' includes flip-flops $FF_{51}$ to $FF_{5(m+1)}$ and m NOR gates $NOR_{51}$ to $NOR_{5m}$. The flip-flops $FF_{51}$ to $FF_{5(m+1)}$ and m NOR gates $NOR_{51}$ to $NOR_{5m}$ are substantially the same as flip-flops $FF_{31}$ to $FF_{3(m+1)}$ and m NOR gates $NOR_{31}$ to $NOR_{3m}$ of FIG. 10, and thus descriptions thereof are omitted. Furthermore, shift register 340' has the same construction as shift register 330', and VCLK22' and VSP22' are inputted as clock and starting signals, respectively.

The clocks VCLK21' and VCLK22' inputted to shift registers 330' and 340' have the same cycle as the clock VCLK23 of shift register 350. The starting signals VSP21' and VSP22' of shift registers 330 and 340 have a low level pulse, while the clocks VCLK21' and VCLK22' are at a high level.

As shown in FIG. 18, the output signals out21[i]' and out22[i]' having high level pulses are shifted by half of a clock cycle of clock VCLK23. The width of the high level pulse corresponds to half of a clock cycle of clock VCLK23. The construction and operation of the scan driver can be easily understood from the above descriptions, and thus the detailed description is omitted.

As such, the construction of a scan driver can be simplified by using the shift register of FIG. 10 as shift registers 330', 340' and 350 of the scan driver. Furthermore, the clock cycles of clocks VCLK21' and VCLK22' are longer than the clock cycle of FIG. 15, and thus the frequency can be reduced.

As mentioned above, scan driver 300' according to the fourth and fifth exemplary embodiments of the present invention sequentially outputs a first output signal having high level pulses. The number of the high level pulses is one-half the number of the precharge pulses, or a larger number than one-half the number of the precharge pulses by 1. The cycle of the high level pulse is twice the width. Scan driver 300' sequentially outputs a second output signal for the first output signal to be shifted by the precharge period, and generates a pulse corresponding to the precharge pulse, while the first output signal and the second output signal have different levels from each other.

Figure 19:
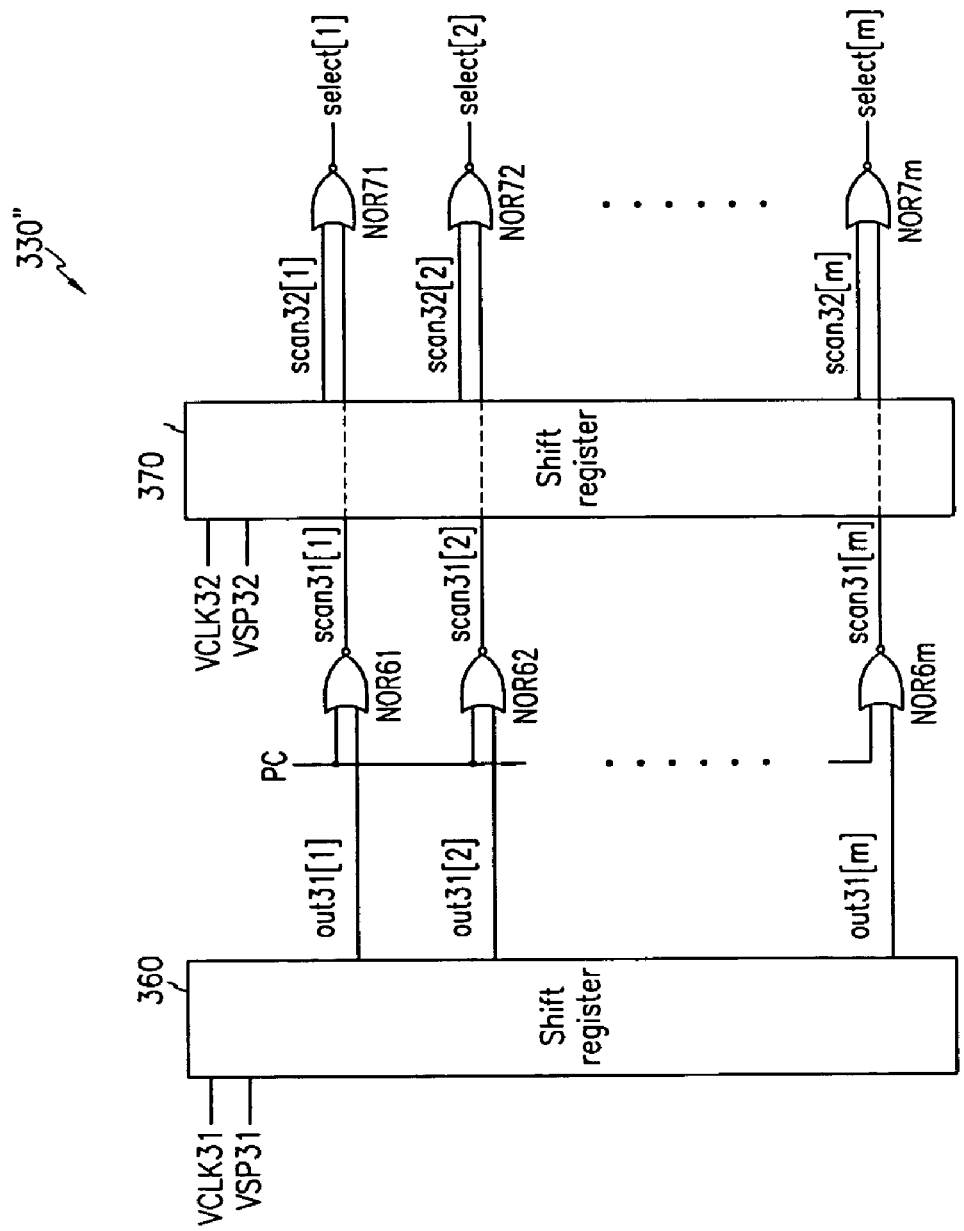
FIG. 19 shows a scan driver according to a sixth exemplary embodiment of the present invention.
Figure 20:
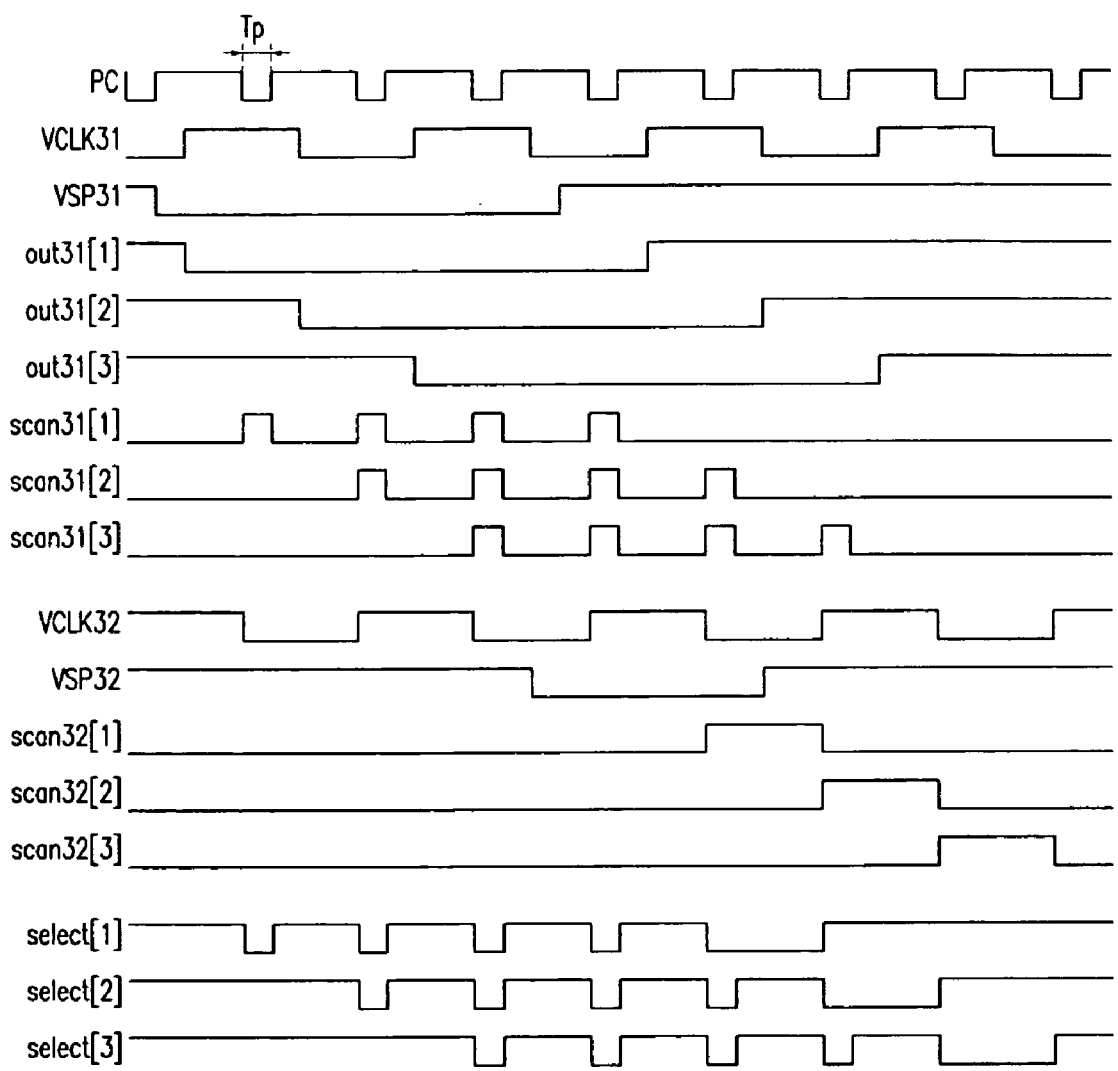
FIG. 20 is a signal timing diagram of the scan driver according to the sixth exemplary embodiment of the present invention.

FIG. 19 shows scan driver according to a sixth exemplary embodiment of the present invention, and FIG. 20 is a signal timing diagram of the scan driver according to the sixth exemplary embodiment of the present invention.

As shown in FIG. 19, scan driver 300" according to the sixth exemplary embodiment of the present invention includes two shift registers 360 and 370, and a plurality of NOR gates NOR$_{61}$ to NOR$_{6m}$ and NOR$_{71}$ to NOR$_{7m}$.

As shown in FIG. 18 and FIG. 19, shift register 360 receives a clock signal VCLK31 and a starting signal VSP31, and shifts the output signals out31[1] to out31[m] by half of a clock cycle of clock VCLK31, and sequentially outputs the resultant signal. The output signal out31[i] has one low-level pulse in one cycle, and the width of the low-level pulse is twice the clock cycle of clock VCLK31, i being an integer from 1 to m.

NOR gate NOR$_{51}$ performs a NOR operation on a precharge control signal PC and the output signal out31[i] of shift register 360, and outputs the output signal scan31[i]. As shown in FIG. 20, the precharge control signal PC has a low-level pulse in a predetermined cycle. The width Tp of the low-level pulse is the same as the precharge period, and the cycle of the precharge control signal PC corresponds to half of a clock cycle of clock VCLK31. As such, the width of the low-level pulse of the output signal out31[i] becomes four times the cycle of the precharge control signal PC, and the four low-level pulses of the precharge control signal PC correspond to the output signal out31[i].

NOR gate NOR6i outputs a high-level pulse when both the precharge control signal PC and the output signal out31[i] are at a low level, and thus the output signal scan31[i] of the NOR gate NOR6i has four high-level pulses in one cycle. The width and cycle of the high-level pulse are the same as the width and cycle, respectively, of the precharge control signal PC, and the precharge pulse may be generated by the high-level pulse. Furthermore, an output signal out31[i+1] is the signal for the output signal out31[i] to be shifted by half of a clock cycle of clock VCLK31, and thus the output signal scan31[i+1] of NOR gate NOR$_{6(i+1)}$ is the signal for the output signal scan31[i] to be shifted by half of a clock cycle of clock VCLK31. That is, the three pulses of four high-level pulses of the output signal scan31[i+1] correspond to the high-level pulse of the output signal scan31[i].

Shift register 370 receives a clock signal VCLK32 and a starting signal VSP32, shifts the output signals scan32[1] to scan32[m] by half of a clock cycle of clock VCLK31, and sequentially outputs the resultant signal. The output signals scan32[i] to scan32[m] have one high-level pulse in one cycle. The width of the high-level pulse of the output signal scan32[i] is ½ times the clock cycle of clock VCLK32, and the cycle of the clock VCLK32 is the same as that of the clock VCLK31. The start time point of the high-level pulse in the output signal scan32[i] is half of a clock cycle of clock VCLK32 away from a start time point of the last high-level pulse in the output signal scan31[i].

NOR gate NOR7i performs a NOR operation on an output signal scan32[i] of shift register 360 and an output signal scan 31[i] of NOR gate NOR6i, and outputs a selection signal select[i]. The width and cycle of the precharge pulse are the same as the width and cycle, respectively, of the high-level pulse of the output signal scan31[i], and the width of the selection pulse is the same as the width of the high-level pulse of the output signal scan31[i].

Next, shift registers 360 and 370 for generating the output signals out31[i] and scan32[i] described in FIGS. 19 and 20 are described in detail with reference to FIG. 21 to FIG. 25.

Figure 21:
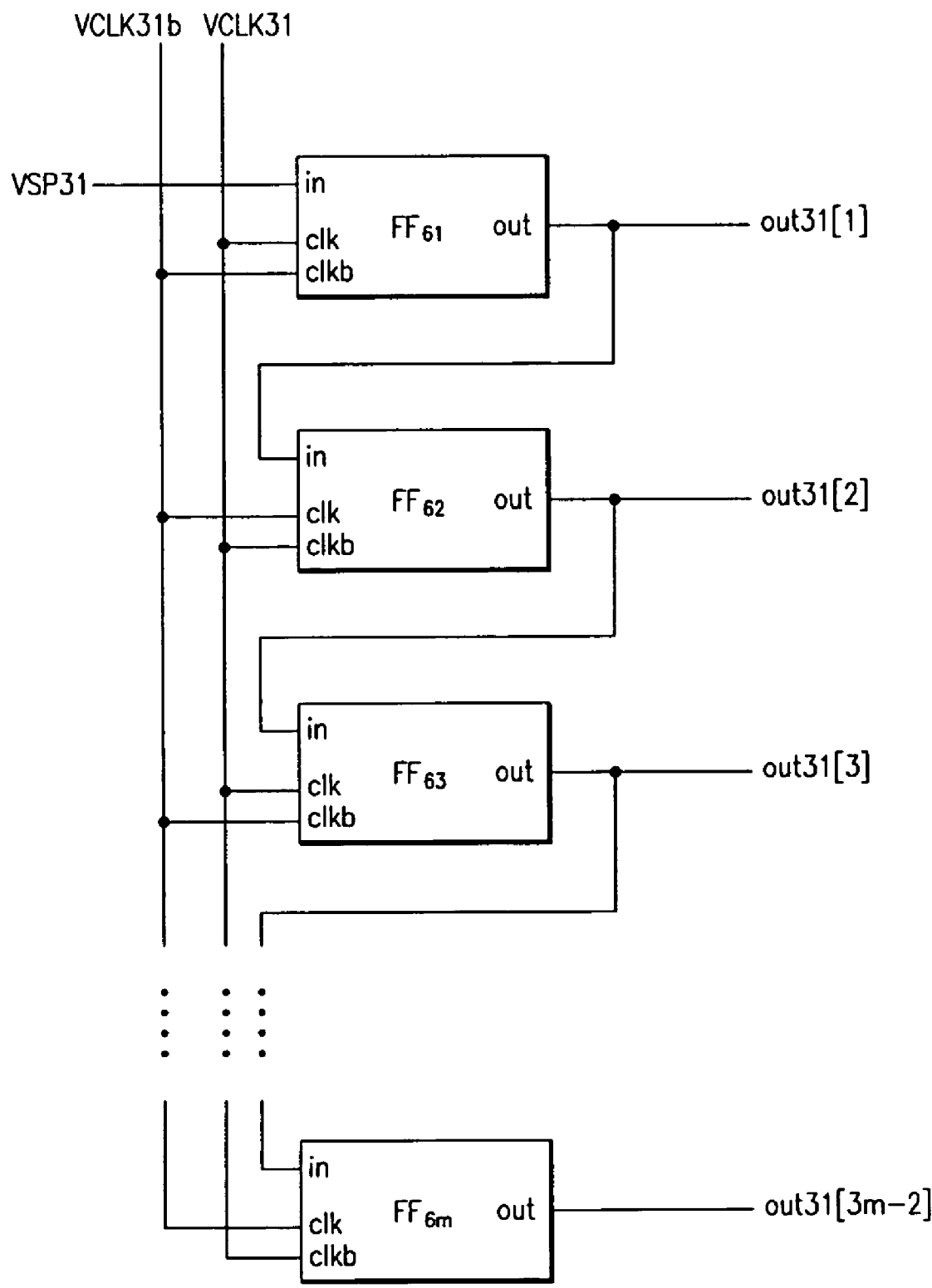
FIG. 21 is a simplified circuit diagram of a first shift register in the scan driver of FIG. 19.

FIG. 21 is a simplified circuit diagram of a first shift register in the scan drive of FIG. 19. In FIG. 21, VCLK31b indicates an inverted version of a clock signal VCLK31, but VCLK31b is not shown in the signal timing diagram of the FIG. 20.

As shown in FIG. 21, shift register 360 includes m flip-flops FF61 to FF6m, and output signals of each flip-flop FF6i become an output signal out31[i] of shift register 360, i being an integer from 1 to m. In FIG. 20, an input signal of a first flip-flop FF$_6$, is the start signal VSP31 of FIG. 19, and an output signal out31[i] of the ith flip-flop FF$_{6i}$ becomes an input signal of the (i+1)th flip-flop FF$_{6(i+1)}$.

The flip-flop FF$_{6i}$ outputs an input signal in as it is inputted when a clock clk is at a high level, but the flip-flop FF$_{6i}$ latches the input signal in inputted when the clock clk was at a high level, and outputs the resultant signal as does the flip-flop of FIGS. 8A and 8B. Furthermore, the clock clk is inverted between two adjacent flip-flops FF$_{6i}$ and FF$_{6(i+1)}$, as does the shift register of FIG. 8A.

In FIG. 20, the flip-flop FF$_{6i}$ which is located at an odd-numbered position in the column direction receives clocks VCLK31 and VCLK31b as inner clocks clk and clkb, respectively. The flip-flop FF$_{6i}$ which is located at an even-numbered position in the column direction receives clocks VCLK31 and VCLK31b as inner clocks clk and clkb, respectively. The starting signal VSP31, which is the input signal in of flip-flop FF61, has a low level pulse in two clock cycles when the clock VCLK31 is at a high level. Then, the flip-flops FF$_{61}$ to FF$_{6m}$ can shift output signals out31[1] to out31[m] having low-level pulses in two clock cycles of clock VCLK31 by half of a clock cycle of clock VCLK31, and sequentially output the resultant signals.

Furthermore, as shown in FIG. 7 and FIG. 20, the output signal scan32[i] of shift register 370 is the same as the output signal scan12[i] of shift register 320 of FIG. 10. Thus, when the clock signal VCLK32 and the starting signal VSP32 are inputted to shift register 320 of FIG. 10, the output signal scan32[i] of shift register 370 can be generated.

As such, scan driver 300" described in FIG. 19 to FIG. 21 can generate the selection signal select[i] shown in FIG. 4. Although the selection signal has four precharge pulses in FIG. 19 to FIG. 21, scan driver 300" of FIG. 19 to FIG. 21 can generate a selection signal having other numbers of precharge pulses.

For example, for 2n precharge pulses, the width of the high-level pulse is established to be twice the cycle of the precharge control signal PC in the output signal out31[i] of shift register 360. Then, the output signals scan31 [i] of NOR gate NOR5$i$ have 2n high-level pulses.

Scan driver 300" of FIG. 19 can be applied to generate odd-numbered precharge pulses in addition to even-numbered precharge pulses. Hereinafter, the case of generating an odd number of precharge pulses is described with reference to FIG. 22, which is a signal timing diagram of a scan driver according to the seventh exemplary embodiment of the present invention, specifically, the scan driver 300" thereof.

Figure 22:
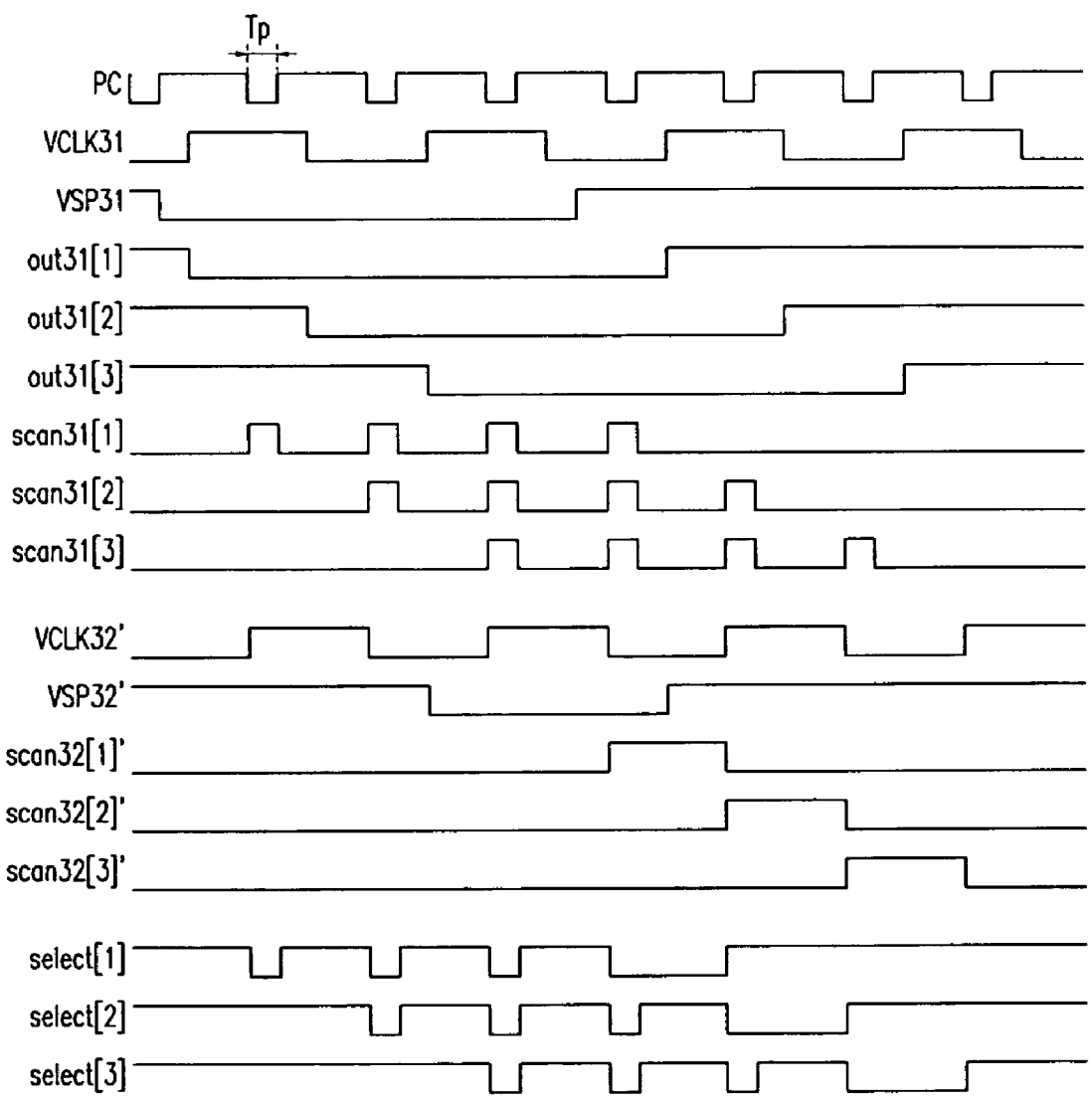
FIG. 22 is a signal timing diagram of a scan driver according to a seventh exemplary embodiment of the present invention.

The signal timing of FIG. 22 is the same as the signal timing of FIG. 20, excluding the timing of the starting signal VSP32', the signal clock VCLK32', and the output signal 32[i]'.

In detail, the start time point of the last high level pulse of the output signal scan31[i] of NOR gate $NOR_{6i}$ is established so as to correspond to the start time point of the high-level pulse of the output signal scan32[i]' of shift register 370. The last high-level pulse of the output signal scan31[i] of NOR gate $NOR_{6i}$ is subjected to a NOR operation with the high-level pulse of the output signal scan32[i]' of shift register 370, and thus an odd number of precharge pulses can be generated.

As such, the method described in FIG. 21 can be applied to the second to fifth exemplary embodiments. That is, in the second to fifth exemplary embodiments, the start time points of the last high-level pulse of the output signals scan11[i], scan11[i]', scan21[i] are established to correspond to the start time points of the high-level pulse of the output signals scan12[i], scan12[i]', and scan22[i]. Then, the number of precharge pulses can be made less than the number of high-level pulses by 1 in the selection signal select[i].

Shift register 360 having half of a clock cycle shift function is applied in FIG. 19 to FIG. 22. However, shift register 360' having a one clock cycle shift function can also be applied. Hereinafter, such an exemplary embodiment is described in detail with reference to FIG. 23 and FIG. 24.

Figure 23:
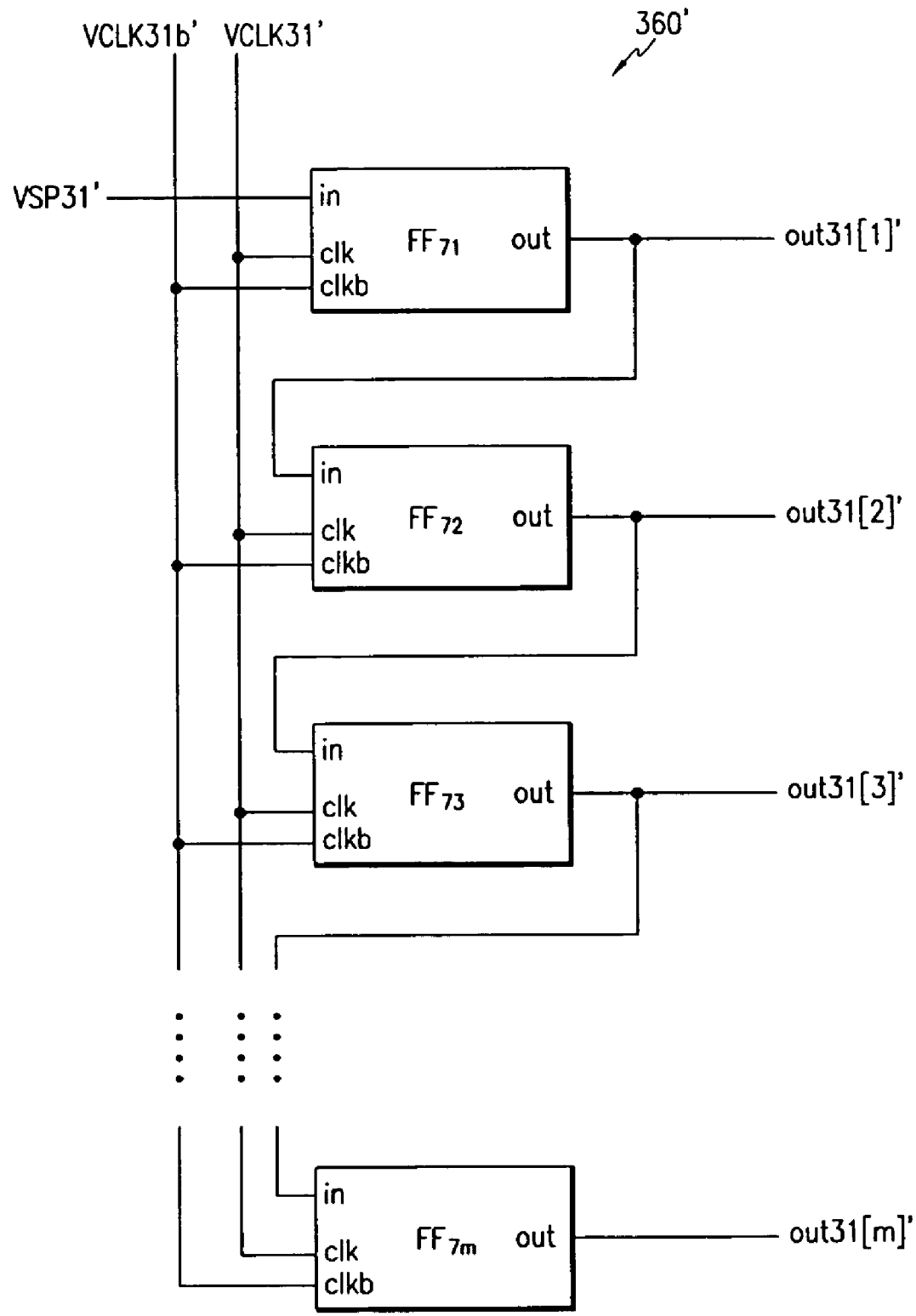
FIG. 23 is a simplified circuit diagram of a first shift register in a scan driver according to an eighth exemplary embodiment of the present invention.
Figure 24:
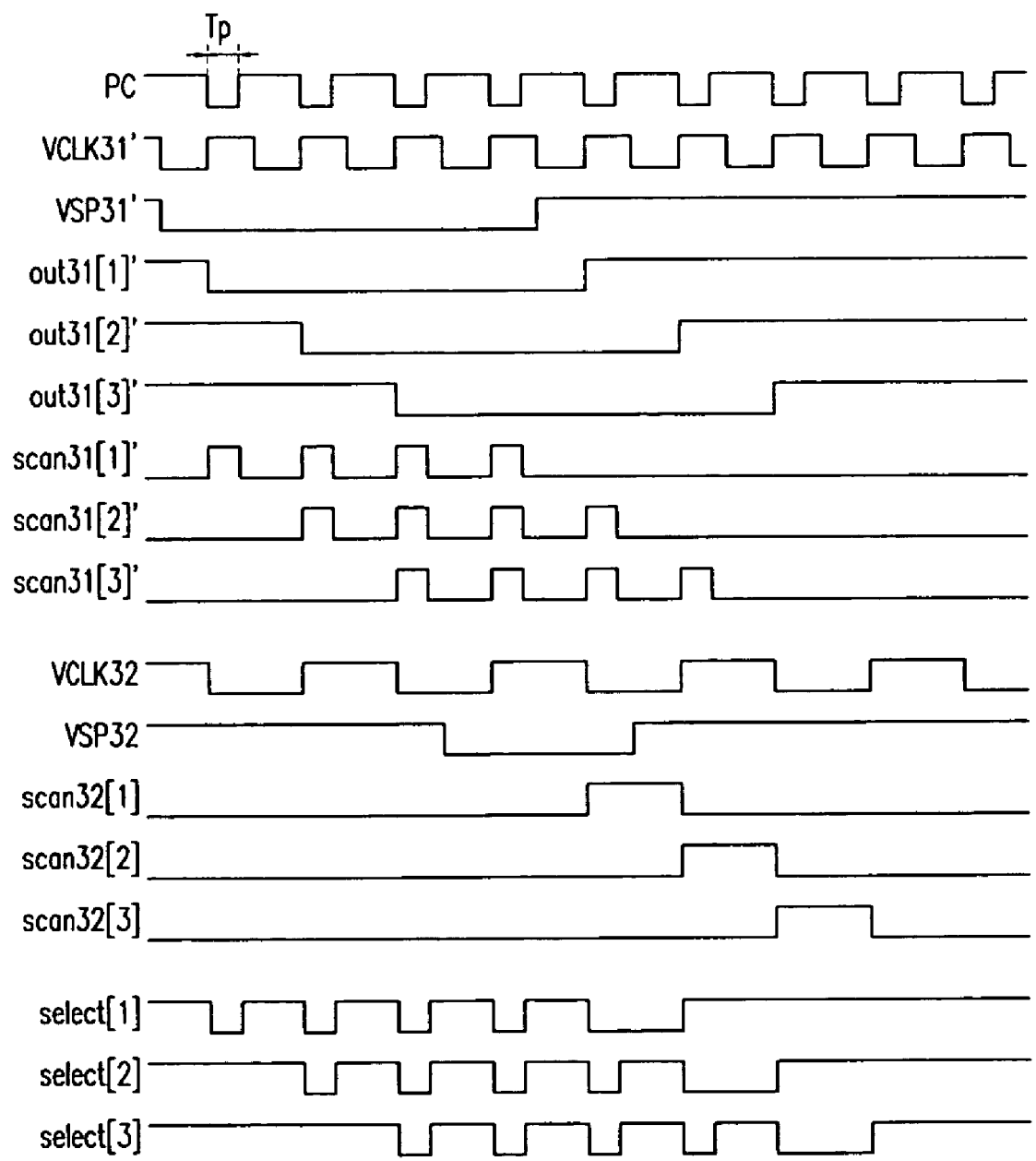
FIG. 24 is a signal timing diagram of the scan driver according to the eighth exemplary embodiment of the present invention.

FIG. 23 is a simplified circuit diagram of a first shift register in a scan driver according to an eighth exemplary embodiment of the present invention, and FIG. 24 is a signal timing diagram of the scan driver according to the eighth exemplary embodiment of the present invention.

As shown in FIG. 23, shift register 360' includes m flip-flops $FF_{71}$ to $FF_{7m}$, and the output signal of the flip-flop $FF_{7i}$ becomes the output signal out31[i]' of shift register 360', i being an integer from 1 to m.

The flip-flop $FF_{7i}$ receives the clock signals VCLK31 and VCLK31$b$ as inner clocks clk and clkb, respectively. The flip-flop $FF_{7i}$ delays a signal inputted at a low level of clock clk by half of a clock cycle of clock clk and outputs the resultant signal during one clock cycle of clock clk, as do the flip-flops described in FIGS. 13A and 13B. Thus, the flip-flops $FF_{71}$ to $FF_{7m}$ can shift the output signals out31[1]' to out31[m]' by one clock cycle of clock VCLK331', and sequentially output the resultant signal as shown in FIG. 24.

However, the flip-flop $FF_{7i}$ shifts the output signal by one clock cycle of clock VCLK31', and thus the clock cycle of clock VCLK31' is one-half of the clock cycle of clock VCLK32, while the clock cycle of clock VCLK31' is the same as the cycle of the precharge control signal PC, apart from FIG. 19. Furthermore, the output signal out31[i]' has a low-level pulse, the width of which is four times the cycle of the precharge control signal PC, and thus the width of the low-level pulse of the output signal out31[i]' is the same as four times the clock cycle of clock VCLK31'. The starting signal VSP311', the input signal in of the flip-flop $FF_{71}$, is converted to a high-level signal after the clock VCLK31' has low levels during the four cycles of clock VCLK31'. Then, the flip-flops $FF_{71}$ to $FF_{7m}$ shift the output signals out31[i] to out31[m]' having the low-level pulse during four clock cycles of clock VCLK31' by one cycle of clock VCLK31', and sequentially output the resultant signal. Thus, the output signal scan31[i]' having four high-level pulses can be outputted, as shown in FIG. 24.

In the scan driver described in FIG. 23 and FIG. 24, when the high-level pulse of the output signal scan32[i] of shift register 370' is established so as to correspond to the last-high level pulse of the output signal scan31[i]' of NOR gate NOR6$i$, an odd number of precharge pulses can be generated. Furthermore, in the scan driver, the number of high-level pulses of the output signal scan31[i]' of NOR gate NOR6$i$ can be established so as to be an odd number. That is, the width of the low-level pulse of the output signal out31[i] of shift register 360' can be established so as to be an odd number multiple of the cycle of the precharge control signal PC, that is, an odd number multiple of the clock cycle of clock VCLK31'.

Furthermore, an emit signal emit[i] of FIG. 4 can be generated by using scan driver 300 described in FIG. 23 and FIG. 24. Hereinafter, such an exemplary embodiment is described with reference to FIG. 25.

Figure 25:
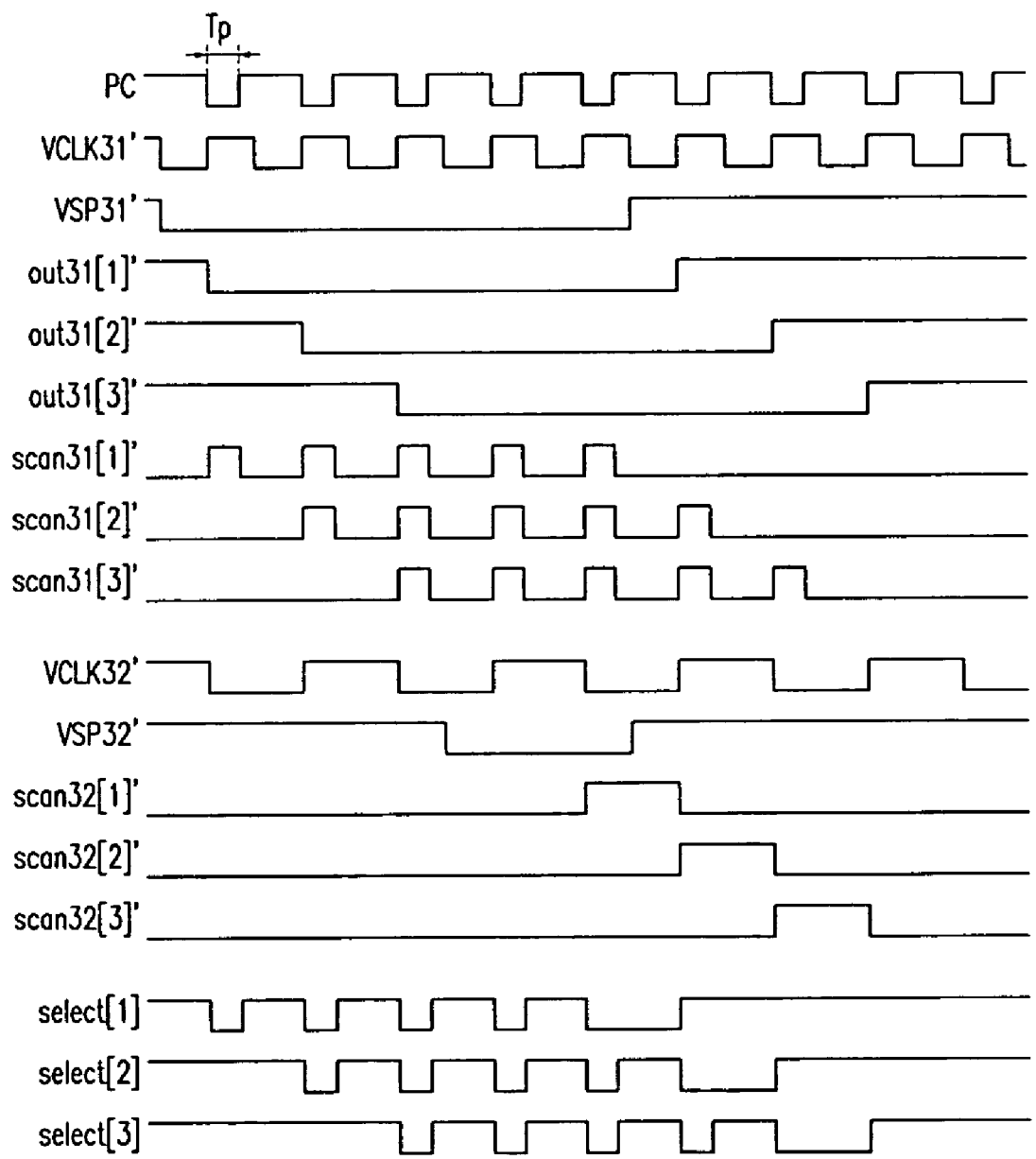
FIG. 25 is a signal timing diagram of a scan driver according to a ninth exemplary embodiment of the present invention.

FIG. 25 is a signal timing diagram of a scan driver according to a ninth exemplary embodiment of the present invention.

As shown in FIG. 25, shift register 370 outputs an output signal scan32[i]', such that a start time point of a high-level pulse in the output signal scan32[i]' corresponds to a start time point of the last high-level pulse in the output signal scan31[i]' of NOR gate NOR6$i$. As such, a period in which the output signal scan31[i]' of NOR gate NOR6$i$ is a high-level pulse, and a period in which the output signal scan32[i]' of shift register 370 is a high-level pulse, are included in a period in which the output signal out31[i]' of shift register 360' is a low-level pulse. That is, while the selection signal select[i] has the selection pulse and the precharge pulse, the output signal out31[i]' of shift register 360' is at a low level. Thus, an inverted signal of the output signal of shift register 360' can be used as the emit signal emit[i].

As such, scan driver 300" according to the sixth to eighth exemplary embodiments of the present invention uses a precharge control signal in which a first pulse having a width corresponding to the precharge pulse is repeated a predetermined number of cycles. In the precharge control signal, the first pulses corresponding to the number of precharge pulses are selected to generate the precharge pulse. In this respect, scan driver 300' selects the first pulse by using a second pulse, the width of which includes the first pulses corresponding to the number of the precharge pulses.

In the first to eighth exemplary embodiments of the present invention, the selection signal outputted from the scan driver is directly applied to the selection scan line. However, the selection signal outputted from the scan driver may be applied to the selection scan line through a buffer formed between the scan driver and the display area. Furthermore, a level shifter may be formed between the scan driver and the display area so as to modify levels of the selection signal and the emit signal.

According to the present invention, the time for charging the data line can be reduced, and thus quick data programming and a correct gray expression can be achieved.

While this invention has been described in connection with certain exemplary embodiments, it is to be understood that the invention is not limited to the disclosed embodiments, but, on the contrary, is intended to cover various modifications included within the spirit and scope of the appended claims and equivalents thereof.

What is claimed is:

1. A driving device for a light emitting display which includes a plurality of scan lines for transferring a selection signal, a plurality of data lines for transferring a precharge current and a data current, and a plurality of pixels defined by the plurality of scan lines and the plurality of data lines, the driving device comprising:
    a first driver for sequentially outputting a first signal, the first signal having a first integer multiple of first pulses and being shifted by a first period;
    a second driver for sequentially outputting a second signal, the second signal having a second pulse and being shifted by a second period; and
    a third driver for sequentially outputting the selection signal in response to the first signal and the second signal, the selection signal having a second integer multiple of third pulses corresponding to at least one of the first integer multiple of first pulses, and having a fourth pulse corresponding to the second pulse;
    wherein the fourth pulse has a wider width than the third pulse;
    wherein a period during which the fourth pulse of the selection signal is applied to a first scan line among the plurality of scan lines includes a fourth period during which the third pulse of the selection signal is applied to a second scan line among the plurality of scan lines and a fifth period during which the selection signal having a different level from the third pulse is applied to the second scan line;
    wherein the data current corresponding to a pixel coupled to the first scan line is applied to a data line among the plurality of data lines during the fifth period; and
    wherein the precharge current having a greater magnitude than the data current is applied to the data line during the fourth period.

2. The driving device of claim 1, wherein the second period is the same as the first period.

3. The driving device of claim 2, wherein a start time point of the second pulse in the second signal is shifted from a start time point of the first pulse in the first signal by a first integer multiple of the first period.

4. The driving device of claim 1, wherein the first driver comprises:
    a fourth driver for shifting a third signal having the first integer multiple of the first pulses by a third period, and for sequentially outputting the third signal; and
    a fifth driver for selecting the third signal sequentially shifted by the first period as the first signal in response to one of a plurality of third signals sequentially outputted by the fourth driver, the first period being a third integer multiple of the third period.

5. The driving device of claim 4, wherein the third period has a width the same as a width of the first pulse.

6. The driving device of claim 4, wherein the fourth driver comprises a shift register, and a clock cycle used in the shift register corresponds to twice a width of the first pulse.

7. The driving device of claim 4, wherein the first driver comprises a shift register, and a clock cycle used in the shift register is the same as a width of the first pulse.

8. The driving device of claim 4, wherein the fourth driver comprises a shift register, and the fifth driver selects the first signal according to a third integer interval in the plurality of third signals sequentially outputted by the fourth driver.

9. The driving device of claim 1, wherein the first driver comprises:
    a fourth driver for shifting a third signal having a third integer multiple of fifth pulses by the first period, and for sequentially outputting the shifted third signal;
    a fifth driver for shifting by the first period a fourth signal having a sixth pulse which is a fifth pulse shifted by the third period, and for sequentially outputting the fourth signal; and
    a sixth driver for outputting the first signal having a first pulse in a period, wherein levels of the first signal and the second signal are different.

10. The driving device of claim 9, wherein the second driver, the fourth driver and the fifth driver respectively comprise a shift register, and cycle of a clock used in the second driver is the same as a cycle of a clock used in the fourth driver and the fifth driver.

11. The driving device of claim 9, wherein the second driver, the fourth driver and the fifth driver respectively comprise a shift register, and a cycle of a clock used in the second driver corresponds to twice a cycle of a clock used in the fourth driver and the fifth driver.

12. The driving device of claim 9, wherein the third integer corresponds to twice the first integer.

13. The driving device of claim 9, wherein the third period has a width the same as a width of the first pulse.

14. The driving device of claim 13, wherein a width between two adjacent fifth pulses in a plurality of the fifth pulses is the same as a width of the fifth pulse.

15. The driving device of claim 14, wherein the third period has a width shorter than the width of the fifth pulse.

16. The driving device of claim 1, wherein the first driver comprises:
    a fourth driver for shifting a third signal having a fifth pulse by the first period, and for sequentially outputting the fifth signal; and
    a fifth driver for receiving a fourth signal having a sixth pulse which is repeated in a predetermined cycle, and the third signal, and for outputting the first signal having the first pulse in a period in which the fifth pulse and the sixth pulse overlap each other.

17. The driving device of claim 16, wherein a width of the sixth pulse is the same as a width of the first pulse.

18. The driving device of claim 16, wherein a width of the fifth pulse includes more than a first integer multiple of the sixth pulses.

19. The driving device of claim 16, wherein a cycle of the sixth pulse is the same as a cycle of the first period.

20. The driving device of claim 16, wherein the fourth driver includes a shift register, and a cycle of a clock used in the fourth driver corresponds to twice a cycle of the sixth pulse.

21. The driving device of claim 16, wherein the fourth driver includes a shift register, and a cycle of a clock used in the fourth driver is the same as a cycle of the sixth pulse.

22. A light emitting display, comprising:
    a display area comprising a plurality of data lines for transferring a precharge current and a data current, a plurality of scan lines arranged in a direction which crosses a direction of the data lines, and a plurality of pixels respectively coupled to the data lines and the scan lines; and a scan driver for sequentially applying a selection signal having at least one of a first level of a first pulse and a first level of a second pulse to the plurality of scan lines, the second pulse having a width which is wider than a width of the first pulse;

wherein a period during which the second pulse of the selection signal is applied to a first scan line among the plurality of scan lines includes a fourth period during which the first pulse of the selection signal is applied to a second scan line among the plurality of scan lines and a fifth period during which the selection signal having a different level from the first pulse is applied to the second scan line;

wherein the data current corresponding to a pixel coupled to the first scan line is applied to a data line among the plurality of data lines during the fifth period; and wherein the precharge current having a greater magnitude than the data current is applied to the data line during the fourth period.

23. The light emitting display of claim 22, wherein the first pulse is repeated a predetermined number of times before the second pulse is outputted.

24. The light emitting display of claim 23, wherein an interval between start time points of two adjacent first pulses is substantially the same as an interval between a start time point of the second pulse and a start time point of the first pulse adjacent to the second pulse.

25. The light emitting display of claim 22, wherein the scan driver comprises:
a first driver for shifting a first signal having a predetermined number of third pulses by a first period, and for sequentially outputting the first signal;
a second driver for outputting the first signal, shifted in an interval of a second period, as a second signal in response to one first signal of the first signals outputted sequentially, the second period being an integer multiple of the first period; and
a third driver for generating the first pulse of the selection signal in response to at least one third pulse of the predetermined number of third pulses in the first signal.

26. The light emitting display of claim 25, wherein the second period is substantially the same as a cycle of the third pulse.

27. The light emitting display of claim 22, wherein the scan driver comprises:
a first driver for shifting a first signal having a predetermined number of third pulses by a first period, and for sequentially outputting the first signal;
a second driver for shifting a second signal having fourth pulses by the first period, and for sequentially outputting the second signal, the fourth pulses being the predetermined number of third pulses shifted by a second period;
a third driver for outputting a third signal having a fifth pulse in a period such that respective levels of the first signal and the second signal are different; and
a fourth driver for generating the first pulse of the selection signal in response to at least one fifth pulse of the third signal.

28. The light emitting display of claim 27, wherein an interval between adjacent two third pulses in the first signal is the same as a width of the third pulse.

29. The light emitting display of claim 28, wherein the second period is shorter than the first period.

30. The light emitting display of claim 22, wherein the scan driver comprises:
a first driver for receiving a first signal having a third pulse repeated in a predetermined cycle, for shifting a second signal having a predetermined number of third pulses by a first period, and for sequentially outputting the second period; and
a second driver for generating the first pulse of the selection signal in response to at least one of third pulses of the second signal.

31. The light emitting display of claim 30, wherein the predetermined cycle is the same as the first period.

32. The light emitting display of claim 30, wherein the first driver generates a second signal having a fourth pulse which has a width which is a period including the predetermined number of third pulses, and the first driver selects the third pulse with the fourth pulse of the second signal.

33. The light emitting display of claim 32, wherein the scan driver generates a third signal having a fifth pulse corresponding to the fourth pulse in the second signal, and wherein the pixels stop emitting light in response to the fifth pulse.

34. The light emitting display of claim 22, wherein each pixel comprises:
at least one of a first switch for transferring the data current from one of the data lines in response to the first level in the selection signal applied to the scan line;
a capacitor for charging to a voltage corresponding to the data current transferred;
a transistor for outputting a current according to the voltage charged on the capacitor; and
a light emitting element for emitting light according to a magnitude of the current outputted by the transistor.

35. The light emitting display of claim 22, wherein
the precharge current is substantially the same as a current corresponding to the data current multiplied by a number equal to one more than a number of the second scan lines, the first pulse of the selection signal being applied to the second scan line in the first period.

36. The light emitting display of claim 22, wherein the precharge current allows a current substantially corresponding to the data current to be transferred in the first period to pixels coupled to the first scan line and the second scan line, respectively.

37. A method for driving a light emitting display having a plurality of scan lines for transferring a selection signal, a plurality of data lines for transferring a precharge current and a data current, and a plurality of pixels defined by the plurality of scan lines and the plurality of data lines, the driving method comprising the steps of:
sequentially outputting a first signal having at least one first level of a first pulse while shifting the first signal by a first interval;
selecting the first signal shifted sequentially by a second interval of the first signal and sequentially outputting the selected first signal as a second signal, the second interval being an integer multiple of the first interval;
outputting a third signal having a third pulse corresponding to the first pulse; and
generating at least one fourth pulse in response to at least one third pulse in the third signal, and outputting the selection signal including said at least one fourth pulse;
wherein the selection signal includes a fifth pulse following said at least one fourth pulse, the fifth pulse having a wider width than the fourth pulse;
wherein a period during which the fifth pulse of the selection signal is applied to a first scan line among the plurality of scan lines includes a fourth period during which the fourth pulse of the selection signal is applied to a second scan line among the plurality of scan lines and a fifth period during which the selection signal having a different level from the fourth pulse is applied to the second scan line;

wherein the data current corresponding to a pixel coupled to the first scan line is applied to a data line among the plurality of data lines during the fifth period; and wherein the precharge current having a greater magnitude than the data current is applied to the data line during the fourth period.

38. The driving method of claim 37, wherein a cycle of the first pulse is substantially the same as the second interval.

39. The driving method of claim 37, wherein a width of the first pulse is substantially the same as the first interval.

* * * * *